(12) United States Patent
Clark et al.

(10) Patent No.: US 10,605,987 B2
(45) Date of Patent: Mar. 31, 2020

(54) RE-BASED INTEGRATED PHOTONIC AND ELECTRONIC LAYERED STRUCTURES

(71) Applicant: IQE plc, St. Mellons, Cardiff (GB)

(72) Inventors: Andrew Clark, Mountain View, CA (US); Rich Hammond, Gwent (GB); Rytis Dargis, Oak Ridge, NC (US); Michael Lebby, San Francisco, CA (US); Rodney Pelzel, Emmaus, PA (US)

(73) Assignee: IQE plc, St. Mellons, Cardiff (GB)

( * ) Notice: Subject to any disclaimer, the term of this patent is extended or adjusted under 35 U.S.C. 154(b) by 0 days.

(21) Appl. No.: 16/252,474

(22) Filed: Jan. 18, 2019

(65) Prior Publication Data

US 2019/0227233 A1   Jul. 25, 2019

Related U.S. Application Data

(60) Provisional application No. 62/619,522, filed on Jan. 19, 2018, provisional application No. 62/623,354, filed on Jan. 29, 2018.

(51) Int. Cl.
| | |
|---|---|
| *G02B 6/122* | (2006.01) |
| *H01L 21/02* | (2006.01) |
| *H01S 5/026* | (2006.01) |
| *H01L 21/8258* | (2006.01) |
| *G02B 6/13* | (2006.01) |
| *H01L 29/04* | (2006.01) |

(Continued)

(52) U.S. Cl.
CPC .......... *G02B 6/1225* (2013.01); *G02B 6/131* (2013.01); *H01L 21/02381* (2013.01); *H01L 21/02439* (2013.01); *H01L 21/02516* (2013.01); *H01L 21/02521* (2013.01); *H01L 21/02565* (2013.01); *H01L 21/8258* (2013.01); *H01L 29/045* (2013.01); *H01L 29/2003* (2013.01); *H01S 5/026* (2013.01); *G02B 2006/1208* (2013.01); *G02B 2006/1213* (2013.01); *G02B 2006/12047* (2013.01); *G02B 2006/12061* (2013.01); *G02B 2006/12142* (2013.01); *G02B 2006/12178* (2013.01); *H01L 21/0254* (2013.01); *H01L 21/02433* (2013.01); *H01L 21/02483* (2013.01); *H01L 21/02532* (2013.01); *H01L 21/02535* (2013.01); *H01L 21/02538* (2013.01); *H01L 21/02609* (2013.01); *H01L 27/15* (2013.01); *H01L 29/778* (2013.01); *H01S 5/021* (2013.01); *H01S 5/0264* (2013.01); *H01S 5/0265* (2013.01)

(58) Field of Classification Search
None
See application file for complete search history.

(56) References Cited

U.S. PATENT DOCUMENTS 8,106,381 B2   1/2012   Atanackovic
8,846,504 B1   9/2014   Dargis et al.
(Continued)

FOREIGN PATENT DOCUMENTS

WO   WO2008/109236   9/2008
WO   WO2017/180531   10/2017

*Primary Examiner* — Jerry Rahll
(74) *Attorney, Agent, or Firm* — Haley Guiliano LLP

(57) ABSTRACT

Systems and methods describe growing RE-based integrated photonic and electronic layered structures on a single substrate. The layered structure comprises a substrate, an epi-twist rare earth oxide layer over a first region of the substrate, and a rare earth pnictide layer over a second region of the substrate, wherein the first region and the second region are non-overlapping.

21 Claims, 31 Drawing Sheets

(51) Int. Cl.
  *H01L 29/20* (2006.01)
  *H01S 5/02* (2006.01)
  *H01L 27/15* (2006.01)
  *G02B 6/12* (2006.01)
  *H01L 29/778* (2006.01)

(56) References Cited

U.S. PATENT DOCUMENTS

2006/0065930 A1   3/2006   Kelman
2016/0087160 A1   3/2016   Cheng et al.
2017/0353002 A1   12/2017  Clark et al.

RE-BASED INTEGRATED PHOTONIC AND ELECTRONIC LAYERED STRUCTURES

CROSS REFERENCE TO RELATED APPLICATIONS

This application claims the benefit under 35 U.S.C. § 119(e) of U.S. Provisional Application No. 62/619,522, filed Jan. 19, 2018, and U.S. Provisional Application No. 62/623,354, filed Jan. 29, 2018, both of which are hereby incorporated by reference herein in their entirety.

BACKGROUND OF THE INVENTION

Photonic devices are components for creating, manipulating and/or detecting light. A photonic device can include a laser diode, a light-emitting diode, solar and photovoltaic cells, displays and/or optical amplifiers. Conventionally, photonic devices and electronic devices are formed separately, and may be combined into a circuit if needed. The separate individual manufacturing processes can be costly, and the resulting photonic devices and electronic devices may each consume separate circuit areas.

In addition, for semiconductor manufacturing, lattice match between different layers of different materials can often be an issue, as lattice mismatch between layers can sometimes lead to increased strains among the layered structure. Traditionally, SrTiO3-buffered Si of an orientation of <100> is traditionally used as a starting template for barium (Ba) based perovskite materials, but lattice mismatch often occurs, which impairs the performance of the semiconductor layers. Recently rare earth oxide (REO) bulk substrates of a crystal orientation of <110> are used as a good option for the epitaxy of Ba-based perovskite materials, because the REO substrate is usually lattice matched with Ba-based perovskite. A bulk single crystal lattice matched REO substrate, however, usually has a limited size, e.g., up to 32 mm in diameter, which highly restricts the size of perovskite that can be deposited over the lattice matched REO substrate as well.

SUMMARY

Systems and methods describe growing RE-based integrated photonic and electronic layered structures on a single substrate. The layered structure comprises a substrate, an epi-twist rare earth oxide layer over a first region of the substrate, and a rare earth pnictide layer over a second region of the substrate, wherein the first region and the second region are non-overlapping.

In some embodiments, the substrate is a silicon substrate having a crystal orientation of (100), wherein the epi-twist rare earth oxide layer has a crystal orientation of (110), and wherein the rare earth pnictide layer has a crystal orientation of (100). In some embodiments, the layered structure further comprises an interface layer over a third region of the substrate, wherein the third region is separate from the first region and the second region, wherein the interface layer is composed of silicon dioxide or a wafer bonding material, a silicon layer over the interface layer.

In some embodiments, the silicon layer has a crystal orientation of (111), and the layered structure further comprises a rare earth oxide layer having a crystal orientation of (111) over the silicon layer.

In some embodiments, the silicon layer has a crystal orientation of (100), and the layered structure further comprises another rare earth pnictide having a crystal orientation of (100) over the silicon layer. In some embodiments, the substrate is a silicon substrate having a crystal orientation of (111), and the layered structure further comprises a stack of an interface layer and a silicon layer having a crystal orientation of (100) over the interface layer, wherein the stack covers the first region and the second region, and is between the substrate, and the epi-twist rare earth oxide layer and the rare earth pnictide layer, and a rare earth oxide layer having a crystal orientation of (111) over a third region of the substrate that is separate from the first region or the second region.

In some embodiments, either of the substrate and the silicon layer includes a porous silicon portion. In some embodiments, either of the substrate and the silicon layer comprises a first portion of a first electrical doping type, and a second portion of a second electrical doping type, and wherein the first portion and the second portion of different electrical doping types are generated by adding an additional silicon epitaxial layer to the substrate or the silicon layer to change electrical doping of the substrate or the silicon layer.

In some embodiments, the substrate is a germanium substrate having a crystal orientation of (100). In some embodiments, the substrate is a silicon substrate having a crystal orientation of (100), and the layered structure further comprises an interface layer over a third region of the substrate, wherein the third region is separate from the first region and the second region, and a germanium layer having a crystal orientation of (100) over the interface layer. In some embodiments, locations of the epi-twist rare earth oxide layer, the rare earth pnictide layer and the rare earth oxide layer are interchangeable. In some embodiments, another stack of another interface layer and another silicon layer, wherein the other stack is directly over the silicon layer and aligns with one of the first region and the second region, and wherein one of the epi-twist rare earth oxide layer, the rare earth pnictide layer and the rare earth oxide layer is over the other silicon layer.

In some embodiments, the layered structure further comprises a combination of devices selected from a group of III-V devices, III-N devices, oxide photonic devices, electronic devices and radio frequency devices, over an upper surface of one or more of the epi-twist rare earth oxide layer, the rare earth pnictide layer and the rare earth oxide layer. In some embodiments, the combination of devices further comprises one or more of: a perovskite oxide, a $BaTiO_3$ based modulator, an InP based emitter, a III-N High-electron-mobility transistor, a polar, non-polar or semi-polar III-N device, an epitaxial metal, and a $Sc_xAl_{1-x}N$ filter. In some embodiments, the substrate is a p-type silicon substrate having a portion of n-type silicon that aligns with the first region at an upper surface of the substrate, and the layered structure further comprises an InP based emitter over the rare earth pnictide layer, and wherein the epi-twist rare earth oxide layer is composed of $Gd_{1-y}Er_yO_3$, and wherein Er atoms at the epi-twist rare earth oxide layer are configured to convert a first wave length of light waves emitted from the InP based emitter to a second wave length that is detectable by the portion of n-type silicon.

In some embodiments, the substrate comprises a first porous portion underneath and aligning with the n-type silicon portion, wherein the first porous portion forms a first distributed Bragg reflector that passes the second wave length, and a second porous portion underneath and aligning with the first porous portion, wherein the second porous portion forms a second distributed Bragg reflector that passes the first wave length.

In some embodiments, the layered structure further comprises a photonic device over the epi-twist rare earth oxide layer, and an electronic device over the rare earth pnictide layer. In some embodiments, the photonic device is a stack of a first epitaxial metal, a modulator, and a second epitaxial metal over the modulator, and the electronic device is a III-V electronic field effect transistor.

In some aspects, a layered structure, comprises a substrate, an epi-twist rare earth oxide layer over the substrate, a stack of a first epitaxial metal, a layer forming a modulated optical path, and a second epitaxial metal over the layer, wherein the stack is over a first region on the epi-twist rare earth oxide layer, and a waveguide over a second region on the epi-twist rare earth oxide layer.

In some embodiments, the layered structure further comprises cladding material wrapping at least one side of the epi-twist rare earth oxide layer, the stack and the waveguide, wherein a first refractive index corresponding to the layer forming the modulated optical path or the wave guide is greater than a second refractive index corresponding to the cladding material.

BRIEF DESCRIPTION OF DRAWINGS

Further features of the disclosure, its nature and various advantages will be apparent upon consideration of the following detailed description, taken in conjunction with the accompanying drawings, in which.

DETAILED DESCRIPTION

Embodiments described herein provide a layered structure that allows mixed photonic and electronic device to be integrated on the same platform. For example, the layered structure uses a mixture of rare earth oxide (REO) and rare earth pnictide on a silicon-on-insulator (SOI) substrate formed by a silicon layer of <111> over another silicon layer of <100>, and the SOI wafers containing the two orientations are used to generate discrete photonic/electronic structures that are spatially separated on the wafer. In this way, mixed photonic and electronic devices can be integrated into the structure sharing a common epitaxial platform.

Embodiments described herein also provide an epitwist crystalline rare earth oxide (cREO) based template grown on a silicon wafer, for growing perovskites. Traditionally, perovskites may be grown on a silicon <100> substrate with a SrTiO3 buffer, but the STO buffer may not be lattice matched with the perovskite. Or the perovskite may be grown on an REO substrate in the form of $(M1M2)_2O_3$ cut in a <110> orientation where M1, M2 are rare earths chosen to lattice match to a specific perovskite oxide, but the REO substrate is usually restricted in size. To provide a stable and lattice-matched buffer for perovskite growth on a silicon substrate, epitwist technology can be used to result in a cREO layer on a Si substrate of <100>, and the cREO layer is grown in a <110> direction. Using the cREO layer on Si <100> in a <110> direction can reduce the mismatch problem for perovskite growth.

Figure 1:
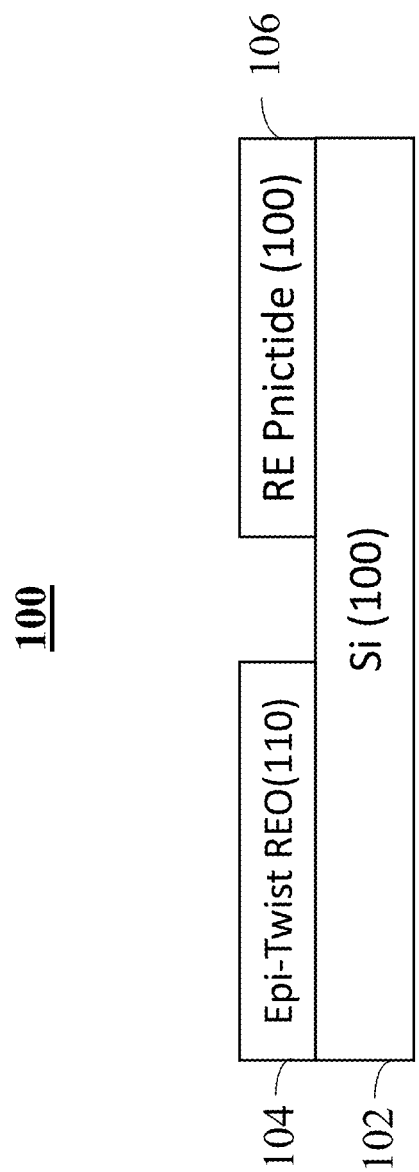
FIG. 1 provides an example of a layered structure illustrating mixed photonic and electronic structures that share a common epitaxial platform, according to an exemplary embodiment described herein.

FIG. 1 provides an example of layered structure 100 illustrating mixed photonic and electronic structures that share a common epitaxial platform, according to an exemplary embodiment described herein. Structure 100 includes a silicon substrate 102 of an orientation of <100>, over which two non-overlapping layered stacks are grown at different regions. For example, at a first region, an epi-twist rare earth oxide (REO) <110> layer 104 is grown over the Si substrate 102.

At a second region which is non-overlapping with the first region on the silicon substrate 102, a rare earth (RE) pnictide layer <100> 106 may be grown. The epi-twist REO layer 104 and RE-pnictide layer 106 may be used as a base to build various devices on the on-overlapping regions respectively. In some embodiments, the second region may be spatially separated from the first region. Or alternatively, the second region may border the first region.

Figure 2:
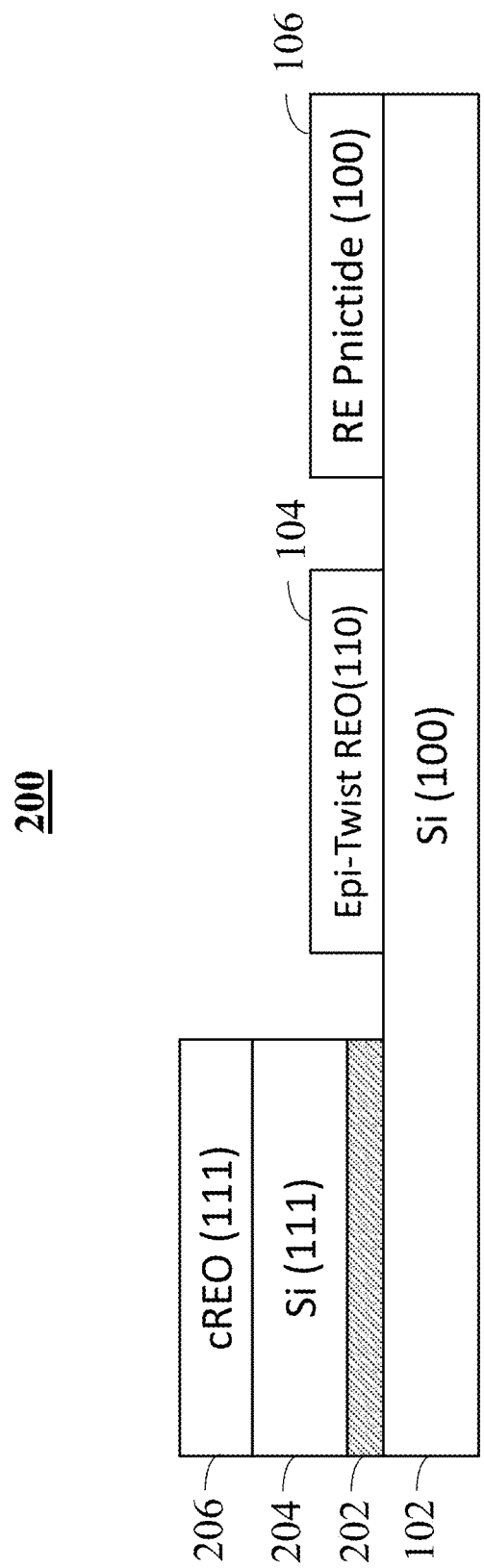
FIG. 2 provides an example of layered structure 200 illustrating another non-overlapping device layer on the substrate described in FIG. 1, according to an exemplary embodiment described herein FIG. 3 provides an example of a layered structure illustrating non-overlapping device layers on the substrate described in FIG. 1, according to an exemplary embodiment described herein.

FIG. 2 provides an example of layered structure 200 illustrating another non-overlapping device layer on the substrate described in FIG. 1, according to an exemplary embodiment described herein. Layered structure 200 depicted in FIG. 2 is similar to layered structure 100 of FIG. 1, except that layered structure 200 has an additional non-overlapping layered stack at a third region of the silicon substrate 102. In some embodiments, at the third region of the substrate 102, an SOI substrate is formed on the silicon substrate 102. In some embodiments, the SOI substrate, is grown over an insulator layer 202. In such embodiments, the insulator layer 202 may be composed of silicon oxide ($SiO_2$). A silicon layer 204 having an orientation <111> may be grown over the layer 202. In some embodiments, the insulator layer 202 may be p-type Si, which can be used as an optical/wave guide. In some embodiments, a portion of the silicon substrate 102 and/or the silicon layer 204 may be converted to porous silicon portion(s) and may thus form a porous-Si-to-porous-Si bond. In some embodiments, the porous portions from the silicon layer 102 of <100> and the silicon layer 204 of <111> may contribute to form a single porous silicon wafer 202. In this way, a silicon wafer that is composed of Si <111>-porous Si—Si <100> can be formed. This silicon wafer may be used to grow epaxial layers discussed throughout the application. A cREO layer 206 is grown over the silicon layer 204. The growth of three non-overlapping device layers at different regions of the silicon substrate 102 is for exemplary purposes only. In some implementations, any number of non-overlapping layers at a number of non-overlapping regions may be grown over the silicon substrate 102. For example, in some embodiments, less than three non-overlapping layered structures may be grown over silicon substrate 102, and in some other embodiments, more than three non-overlapping layered structures may be grown over the silicon substrate 102.

Figure 3:
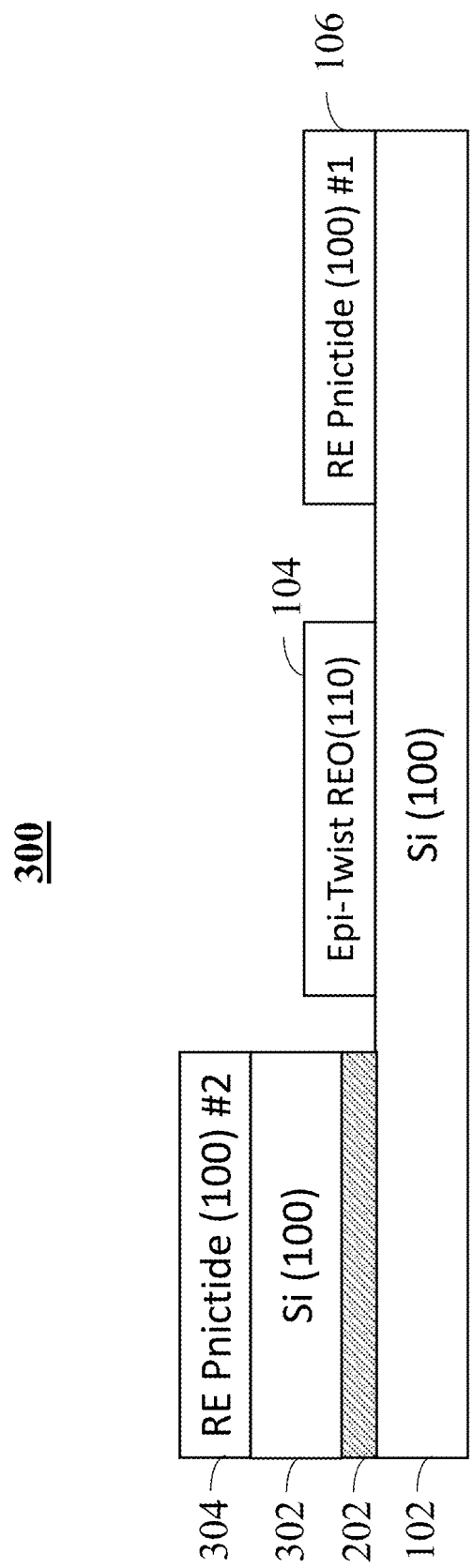

FIG. 3 provides an example of layered structure 300 illustrating non-overlapping device layers on the substrate described in FIG. 1, according to an exemplary embodiment described herein. Layered structure 300 is similar to layered structure 200, except that in layered structure 300, the silicon layer 304 grown over the insulator layer 202 may have an orientation of <100> instead of <111> as depicted in FIG. 2. A second RE-pnictide layer 304 may be grown over the silicon layer 302. The second RE-pnictide layer 304 may be similar or different from the RE-pnictide layer 106 originally present on the silicon substrate 102.

Figure 4:
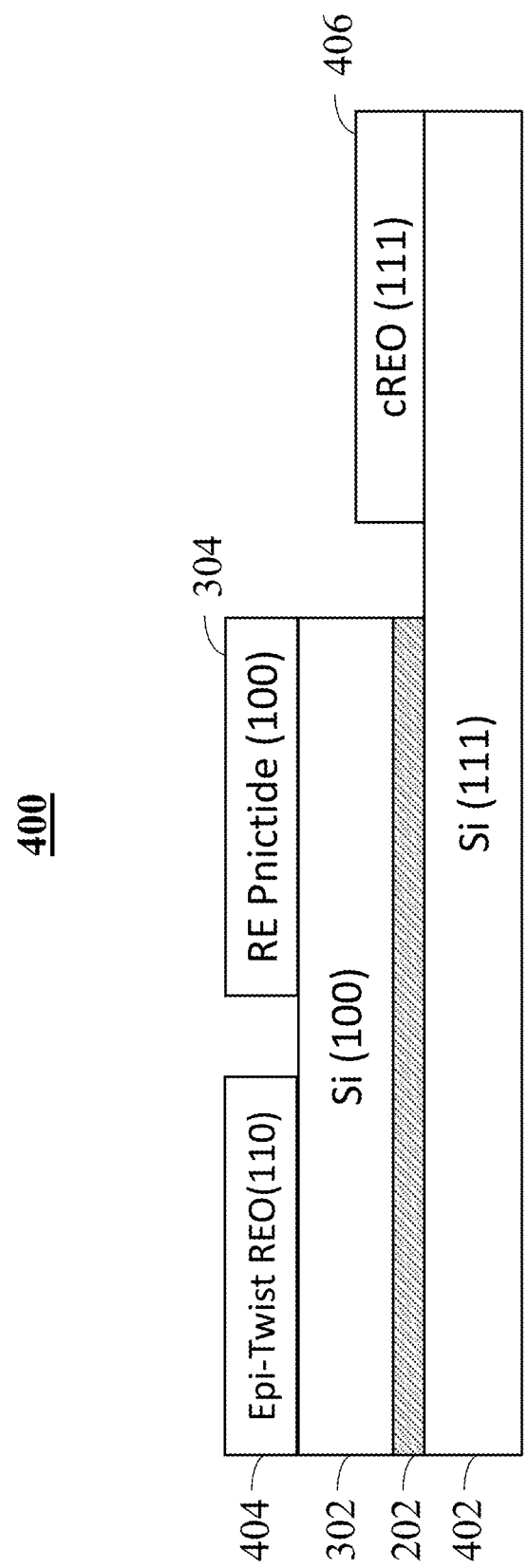
FIG. 4 provides an example of layered structure 400 illustrating non-overlapping device layers on the substrate described in FIG. 1, according to an exemplary embodiment described herein.

FIG. 4 provides an example of layered structure 400 illustrating non-overlapping device layers on a substrate, according to an exemplary embodiment described herein. Structure 400 includes a silicon substrate 102 of an orientation of <111> instead of the <100> orientation as depicted in FIGS. 1-3. In layered structure 400, over the silicon substrate 402, two non-overlapping layered stacks are grown at different regions. For example, at a first region, a cREO layer 406 having an orientation of <111> is grown over the substrate 402.

At a second region which is non-overlapping with the first region on the silicon substrate 102, the insulator layer 202 (as described in FIGS. 2-3) is grown over the substrate 402. As described in FIG. 3, silicon layer 302 having orientation of <100> may be grown over the insulator layer 202. The surface of the silicon layer 302 may further be divided into multiple non-overlapping regions. At a first non-overlapping layer of the silicon layer 302, a RE-pnictide layer 304 may be grown over the silicon layer 302. Similarly, at a second non-overlapping region of the silicon layer 302, an epi-twist REO layer 404 may be grown. The combination of layers 302, 304 and 406 is similar to the layered structure 100 as described in 106.

Figure 5:
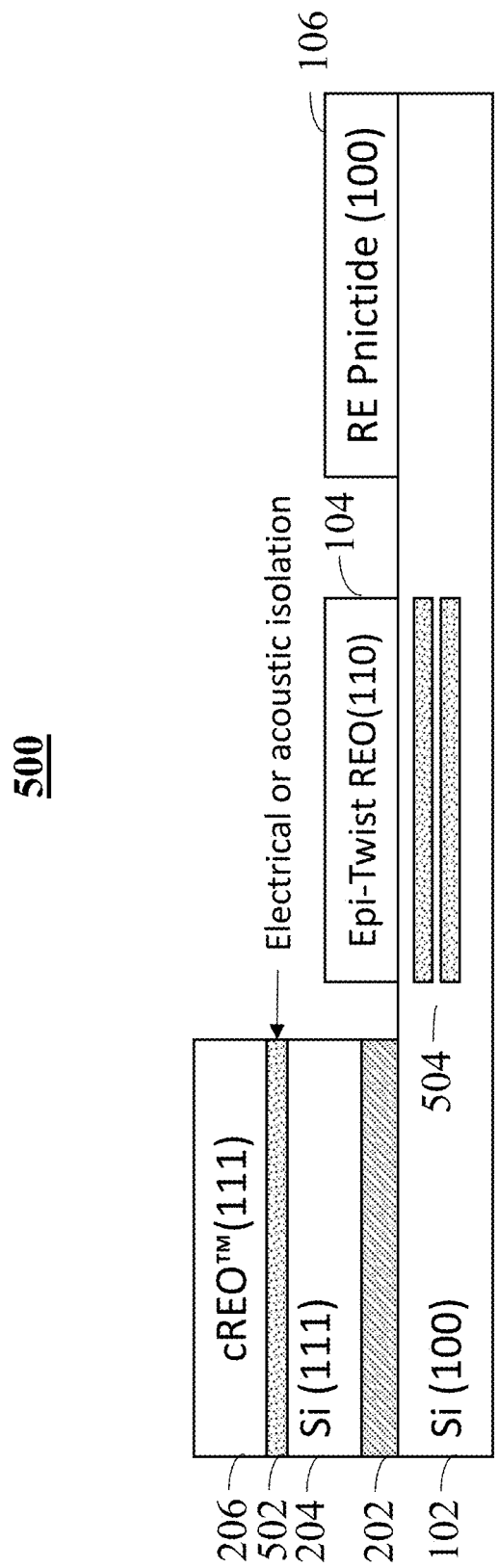
FIG. 5 provides an example of a layered structure illustrating non-overlapping device layers on the substrate described in FIG. 1, according to an exemplary embodiment described herein.

FIG. 5 provides an example of layered structure 500 illustrating non-overlapping device layers on the substrate described in FIG. 1, according to an exemplary embodiment described herein. Layered structure 500 is similar to the layered structure 200 described in FIG. 2, except that silicon layer 204 is modified using porous silicon process to enhance the electric or acoustic application of the device. In FIG. 5, the modification of a portion of the silicon layer 204 results in the porous silicon layer 502 between the silicon layer 204 and the cREO layer 206. The modification of silicon layer 204 may be similar or different from the modification of insulator layer 202 performed. The insulator layer 202 is described in further detail in FIG. 2.

Silicon substrate 102 of layered structure 500 of FIG. 5 may also include alternating layers of silicon and porous silicon layers 504 within the silicon substrate 102. These layers 504, while within the substrate, may be aligned with any of the three non-overlapping regions over which any of the three-layered structures are grown.

Figure 6:
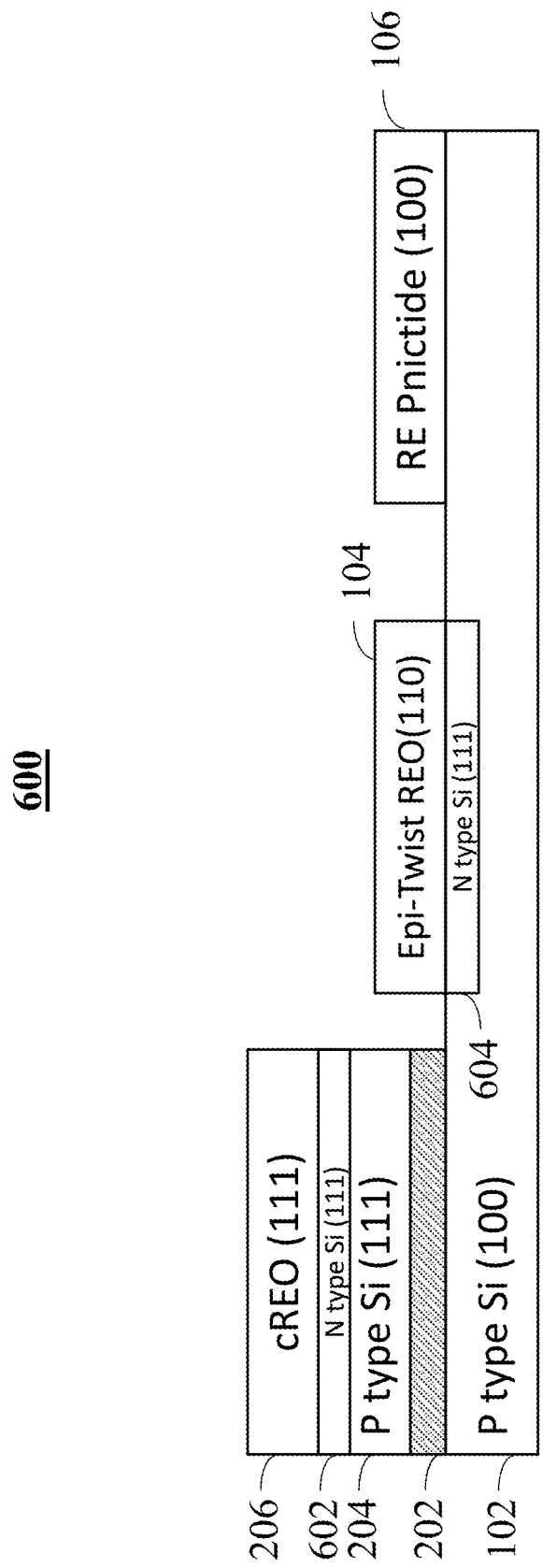
FIG. 6 provides an example of a layered structure illustrating non-overlapping device layers on a substrate, according to an exemplary embodiment described herein.

FIG. 6 provides an example of layered structure 600 illustrating non-overlapping device layers on a substrate, according to an exemplary embodiment described herein. Layered structure 600 is similar to layered structure 500 except that layer structure 600 does not include the alternating silicon and porous silicon layers 504. In layered structure 600, the electrical doping concentration of each of silicon layers 102 and 204 may be modified using additional silicon. In some embodiments, additional silicon may be used to modify the electrical doping of silicon substrate 102 to a p-type substrate. N-type silicon layer 604 having orientation <111> may be inserted in the substrate 102. In some embodiments, the electrical concentration of the silicon substrate 102 and n-type silicon layer 604 may be reversed. Similar to silicon substrate 102, silicon layer of 200 may be converted to a p-type layer using additional silicon. N-type silicon layer 602 may be grown over the modified p-type silicon layer 204. In some embodiments, the electrical doping of silicon layers 204 and 602 may be revered, and a p-type silicon layer may be grown over an n-type silicon layer.

Figure 7:
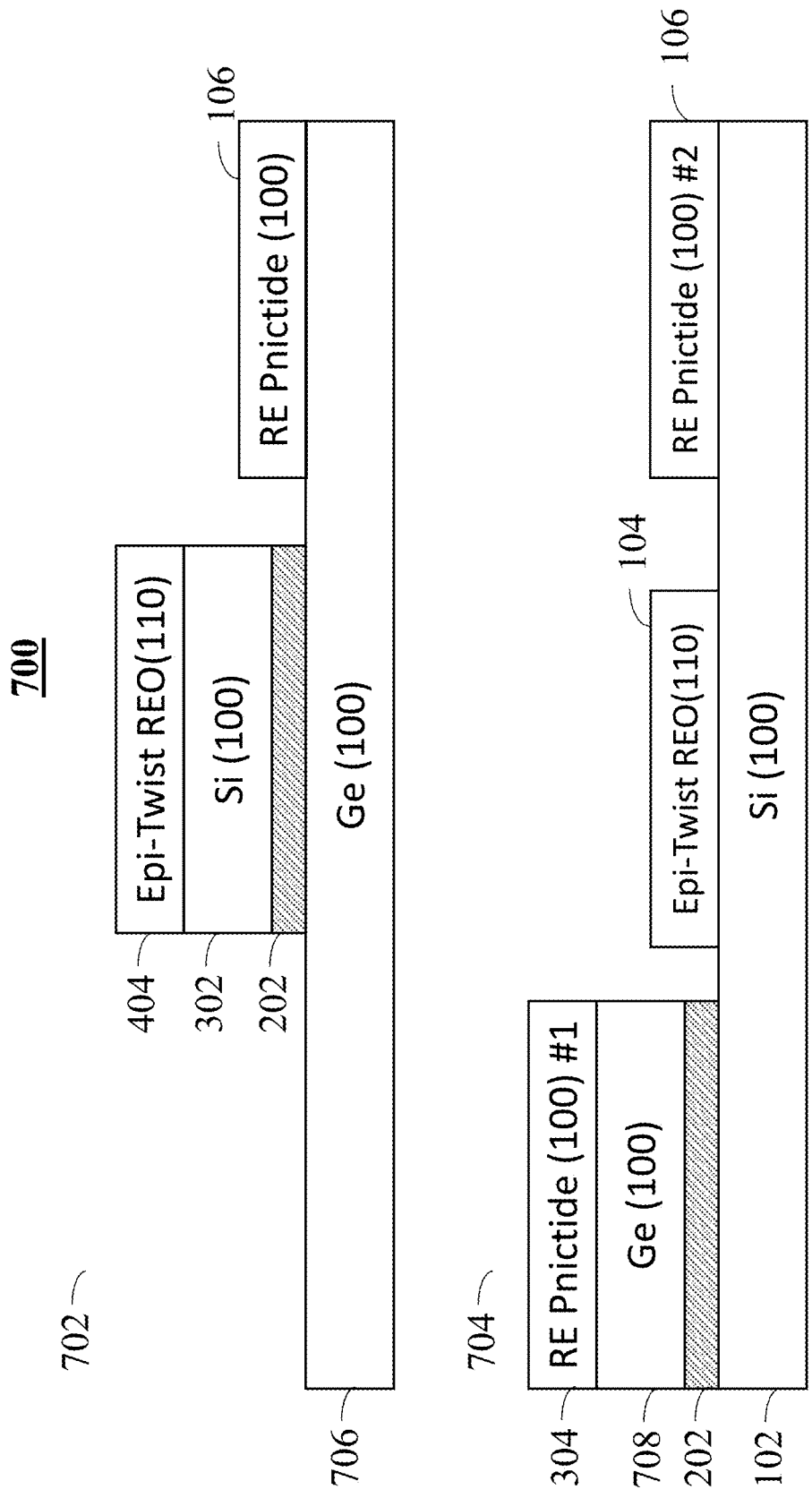
FIG. 7 provides an example of layered structures illustrating non-overlapping device layers on a substrate, according to an exemplary embodiment described herein.

FIG. 7 provides an example of layered structures illustrating non-overlapping device layers on a substrate, according to an exemplary embodiment described herein. Layered structure 702 in FIG. 7 is similar to the layered structure 300 of FIG. 3, except that in layered structure 700, the silicon substrate 102 of FIG. 3 is replaced with a germanium substrate 706 that has an orientation of <100>. The change in the substrate may lead to a change in the composition of the insulator layer 202 grown in a first region of the germanium substrate 706. In some embodiments, insulator layer 202 may be composed of porous Si, or Ge, or a combination of porous Si and Ge. In some embodiments, the insulator layer 202 may be composed of $SiO_2$ as described in FIG. 2. Silicon layer 302 having orientation <100> may be grown over the insulator layer 202. The silicon layer 302 may act as a base over which an epi-twist REO layer 404 over the silicon layer 302. Layered structure 702 allows for a silicon layer 302 over a germanium substrate 706. In a second non-overlapping region of the germanium substrate 706, a RE-pnictide layer 106 may be grown as shown in FIG. 1.

Layered structure 704 is also similar to the layered structure 300 of FIG. 3, except that the silicon layer 302 in layered structure 300 is replaced with a germanium layer 708 with an orientation of <100>. In this embodiment, a germanium layer may be grown over a silicon substrate, which allows for a variety of substrates to grow electronic and acoustic devices.

Figure 8:
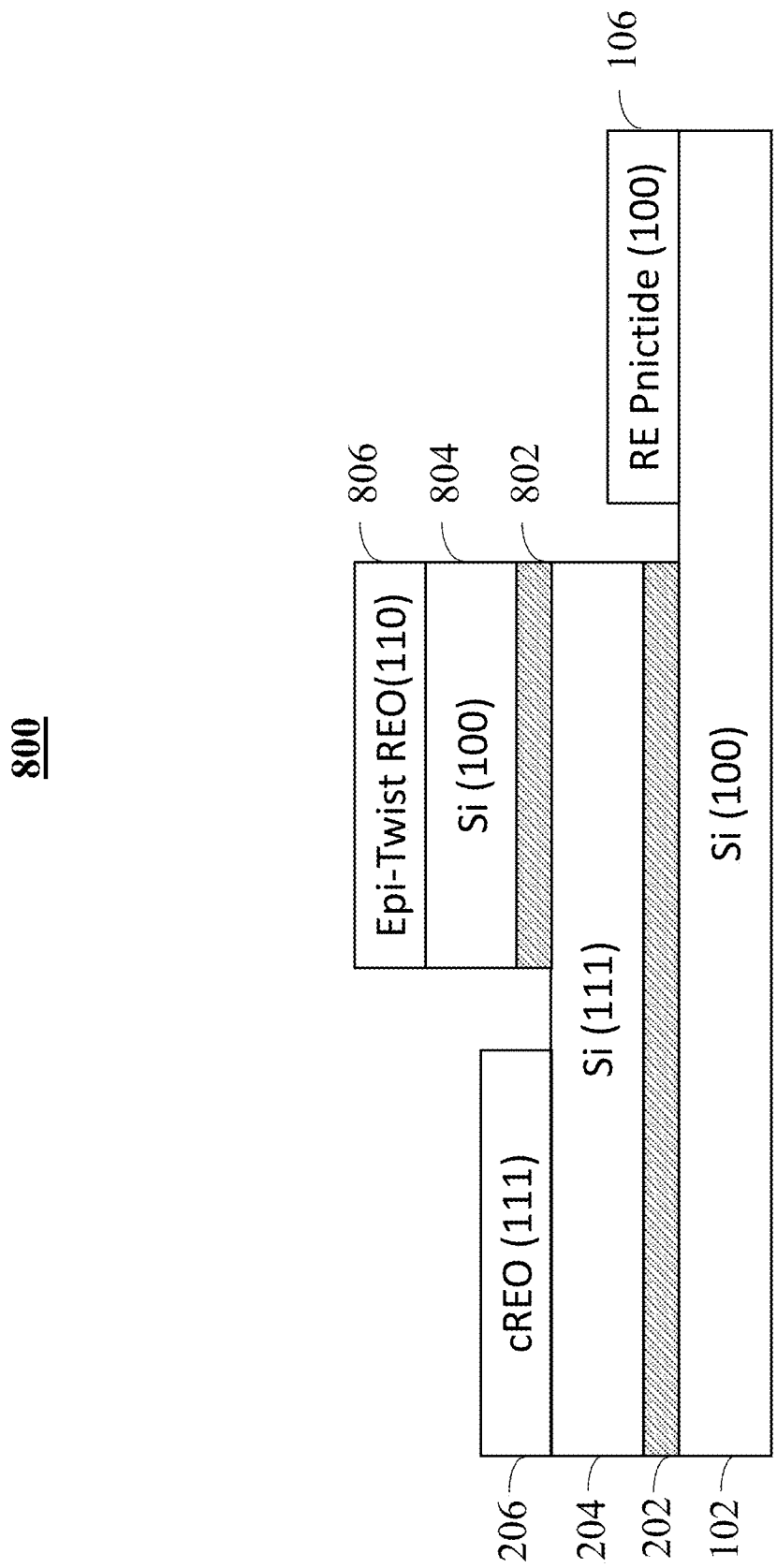
FIG. 8 provides an example of layered structures illustrating non-overlapping device layers on a substrate, according to an exemplary embodiment described herein.

FIG. 8 provides an example of layered structures illustrating non-overlapping device layers on a substrate, according to an exemplary embodiment described herein. FIG. 8 allows for growth of two substrate layers (silicon, or germanium of different orientations) over a substrate layer. In some embodiments, there is a RE alloy available for discrete epitaxial integration on any of Si<100>, Si<111>, or Ge<100>. Layered structure 800 described in FIG. is similar to the layered structure 200 of FIG. 2 except that the layered structure 800 includes an additional non-overlapping region on silicon layer 204 at which a second insulator layer 802 is grown. The process of growing an insulator layer 802 is described in detail in FIG. 2. Silicon layer 804 is grown over insulator layer 802, and epi-twist REO layer 806 is epitaxially grown over silicon layer 804.

Figure 9:
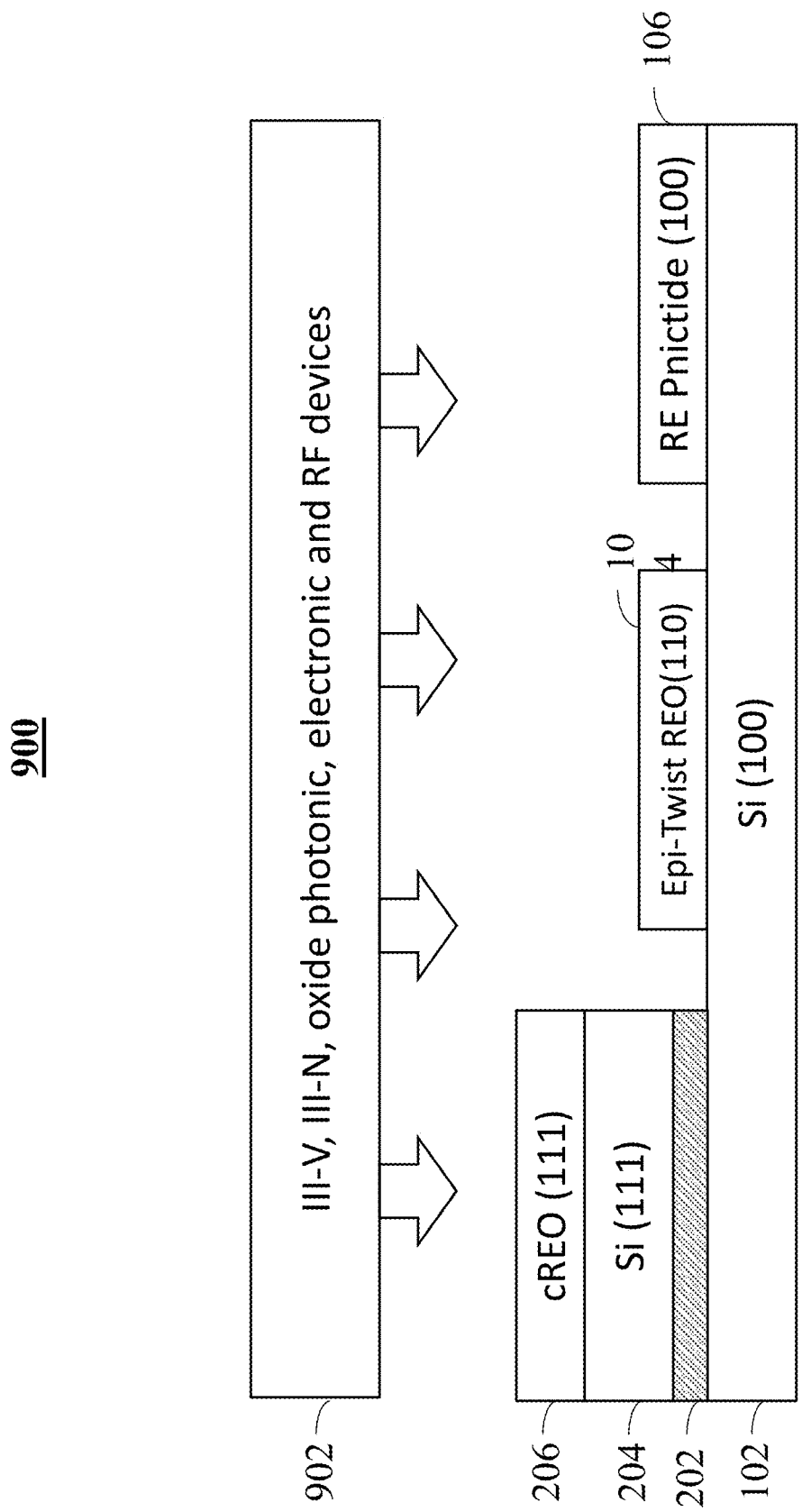
FIG. 9 provides an example of layered structures illustrating non-overlapping device layers on a substrate, according to an exemplary embodiment described herein.

FIG. 9 provides an example of layered structures illustrating non-overlapping device layers on a substrate, according to an exemplary embodiment described herein. FIG. 9 builds on layered structure 200 of FIG. 2. The surface layers cREO 206, epi-twist REO layer 104, and RE-pnictide layer 106 of layered structure 200 may be used as a base to grow different photonic or electronic device layers 902 composed of III-V alloys, III-N alloys, and various other oxides. In some embodiments, different device layers 902 may be grown over different non-overlapping structures of layered structure 900. In such embodiments, multiple electronic and photonic devices may be simultaneously grown over silicon substrate 102.

Figure 10A:
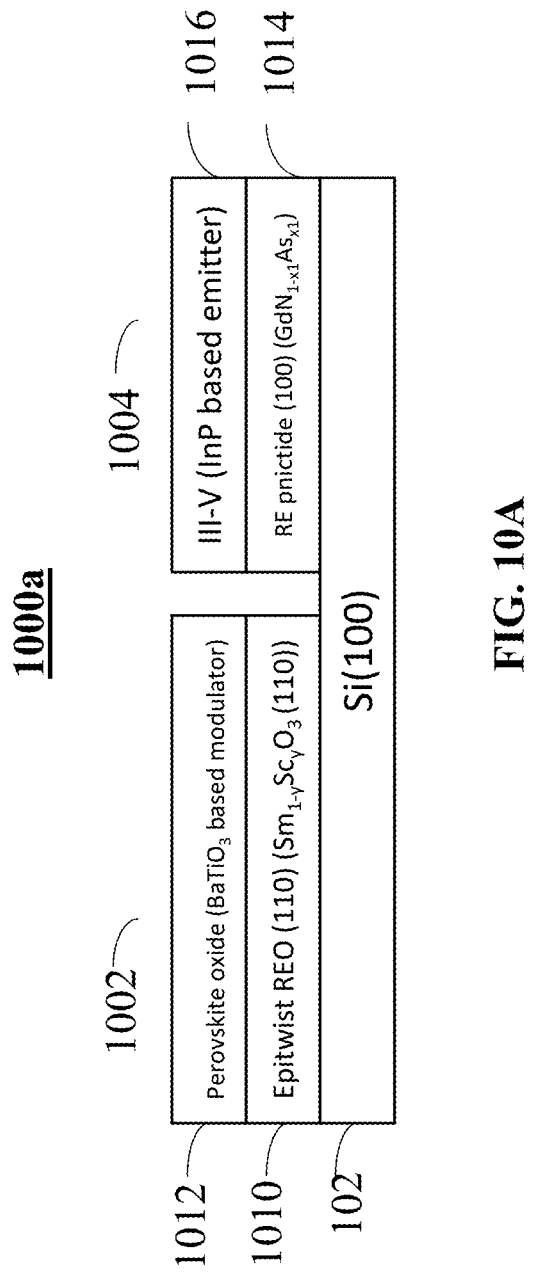
FIGS. 10A-B provides example diagrams illustrating different examples of growing spatially separated stacks including perovskite materials and photonic devices, respectively, on the silicon substrate according to an embodiment described herein.
Figure 10B:
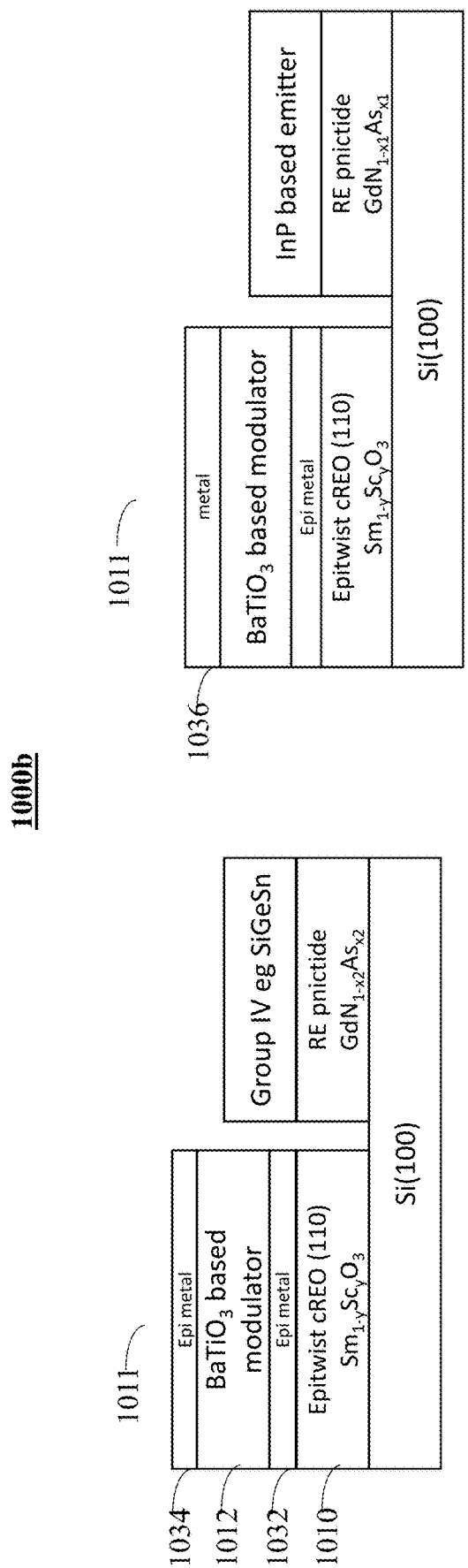

FIGS. 10A-B provides an example diagrams 1000a-b illustrating different examples of growing spatially separated stacks including perovskite materials and photonic devices, respectively, on the silicon substrate according to an embodiment described herein. For example, as shown in FIG. 10A, over the silicon substrate 102 of <100>, a first stack 1002 of epitwist REO layer 1010 of <110> and a perovskite layer 1012, can be grown at a first region on the silicon substrate 102. In some embodiments, the epitwist cREO layer 1010 may be composed of $Sm_{1-y}Sc_yO_3$ ($0 \leq y \leq 1$). In some embodiments, the perovskite material 1012 may include a $BaTiO_3$-based modulator.

In some embodiments, the stack of substrate 102, epitwist REO layer 1010 and the perovskite layer 1012 may be formed as an independent layered structure. In this way, the perovskite layer 1012 may be grown over the REO layer 1010 with lattice match.

In some embodiments, a second stack 1004 of a rare earth pnictide layer 1014 and a photonic device 1016 integrated on top of the rare earth pnictide layer 1014 can be grown at a second region on the silicon substrate 102. In some embodiments, the rare earth pnictide layer 1014 may be composed of $GdN_{1-x}As_x$ ($0 \leq x \leq 1$). In some embodiments, the photonic device may include a group III-V layer, e.g., InP-based emitter 1016. In some embodiments, a group IV layer, e.g., SiGeSn 210, may be grown over the rare earth pnictide layer 206 within the second stack.

The structures shown in diagram 1000 illustrates a dual orientation rare-earth based buffer (e.g., 1010 and 1014) for integration of other layers and/or devices. Both materials above the rare earth buffers are lattice matched to the respective rare earth buffer, e.g., the $BaTiO_3$-based modulator 1012 is lattice matched with the epitwist cREO layer 1010, and the InP-based emitter 1016 is lattice matched with the RE pnictide 1014.

FIG. 10B provides an example block diagram 1000b illustrating different examples of integrating an epitaxial metal electrode into the structures described in FIG. 10A, respectively, on the silicon substrate, according to an embodiment described herein. As shown at 1011 which is similar to the first stack of layers 1002 in FIG. 10A, a first epitaxial metal (e.g., having an orientation of <221>) 1032 is grown between the epitwist cREO layer 1010 and the $BaTiO_3$-based modulator 1012. A second epitaxial metal layer 1034 can be grown over the $BaTiO_3$-based modulator 1012 within the first stack 1011. A vertical modulator at the first stack 311 may be formed, as electro optic effect in the $BaTiO_3$-based modulator 1012 can be strongly directional so as to align the metal electrodes 1032 and 1034. An example of lower epitaxial metal 1032 may be Mo. In some embodiments, the top metal layer 1034 may be a different metal from the metal layer 1032, and may not be epitaxial (e.g., at 1036).

Figure 11:
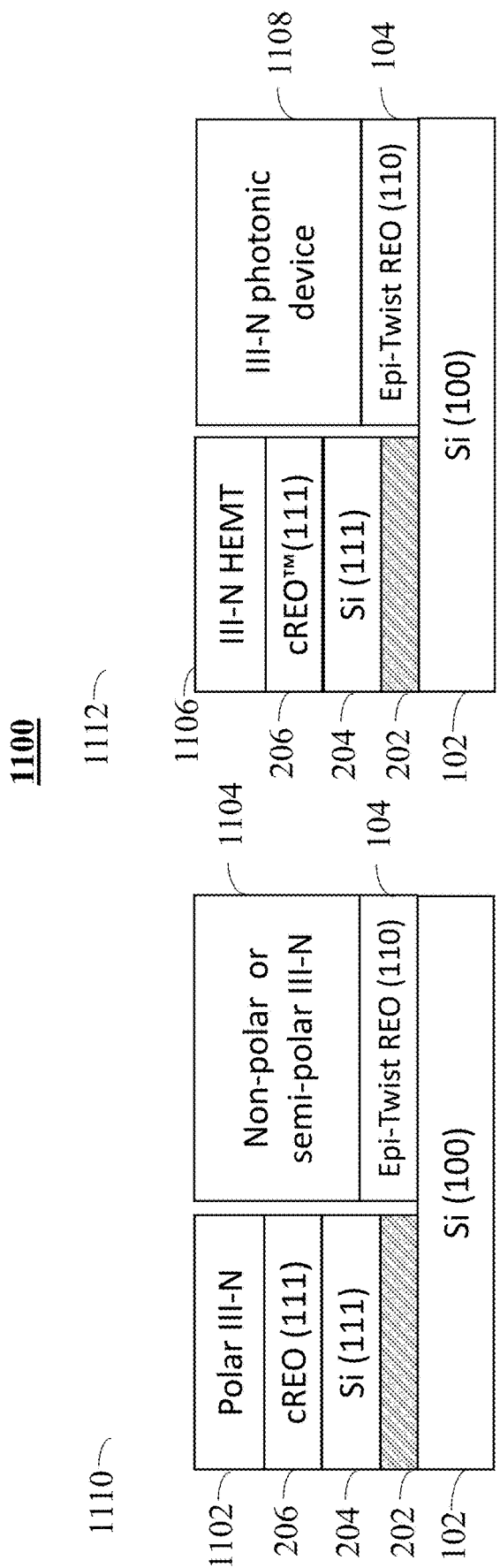
FIG. 11 provides an example diagram 1100 illustrating different examples of growing spatially separated stacks including photonic devices, respectively, on the silicon substrate according to an embodiment described herein.

FIG. 11 provides an example diagram 1100 illustrating different examples of growing spatially separated stacks including photonic devices, respectively, on the silicon substrate according to an embodiment described herein. Layered structure 1110 of FIG. 11 builds on the layered structure 200 of FIG. 2. Layered structure 1110 grows a polar III-N layer 1102 over the cREO layer 206 of layered structure 200. In some embodiments, polar III-N layer 1102 may be a III-N HEMT 1106. Additionally, layered structure 1110 of FIG. 11 grows a non-polar or semi-polar III-N structure over the epi-twist REO layer 104. In some embodiments, non-polar or semi-polar III-N layers may be a III-N photonic device 1108 built on a silicon substrate 102.

In some embodiments, layer 1102 may be composed of SiGeSn having a crystal orientation of 111.

In some embodiments, instead of growing Epi-twist REO at 104 and the III-N photonic device 1104/1108 on top of the epi-twist REO, a stack of a RE pnictide layer and a III-V layer over the RE pnictide layer may be grown over the silicon substrate 102 at the region of 104.

Figure 12:
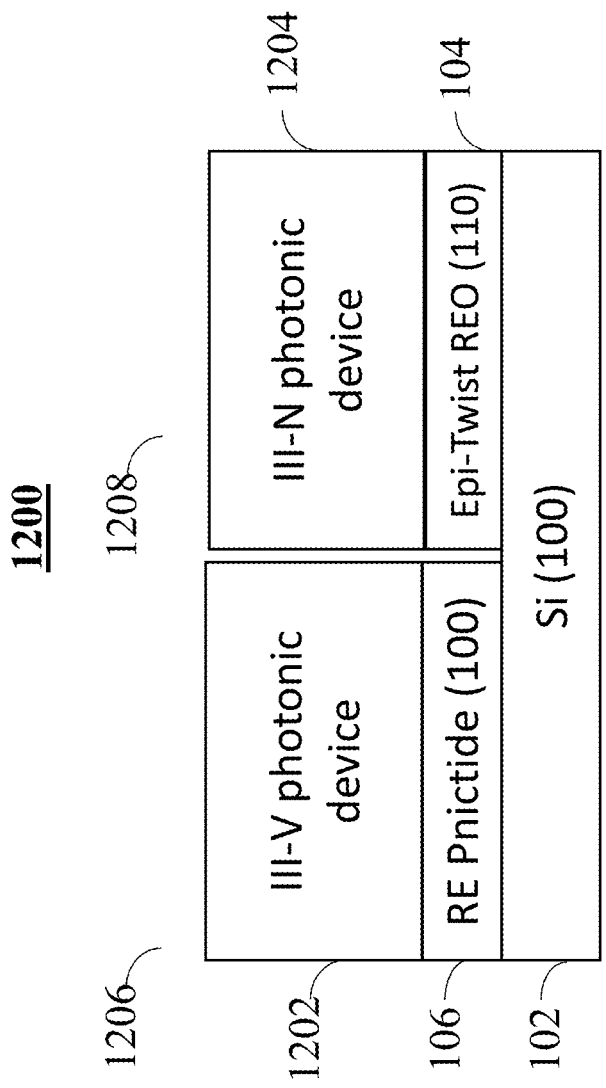
FIG. 12 provides an example diagram 1200 illustrating different examples of growing spatially separated stacks of different photonic devices, respectively, on the silicon substrate according to an embodiment described herein.

FIG. 12 provides an example diagram 1200 illustrating different examples of growing spatially separated stacks of different photonic devices, respectively, on the silicon substrate according to an embodiment described herein. Layered structure 1200 builds on the layered structure 100 of FIG. 1. Layered structure 100 had RE-pnictide layer 106 at a first region of the silicon substrate 102 and epi-twist REO layer 104 at a second non-overlapping region of the silicon substrate 102. A III-V photonic device layer 1202 is grown over the RE-pnictide layer 106 to create a first photonic device 1206 on the silicon substrate 102. A III-N photonic device layer 1204 is grown over epi-twist REO layer 104 to generate a second photonic device over the silicon substrate 102.

Figure 13:
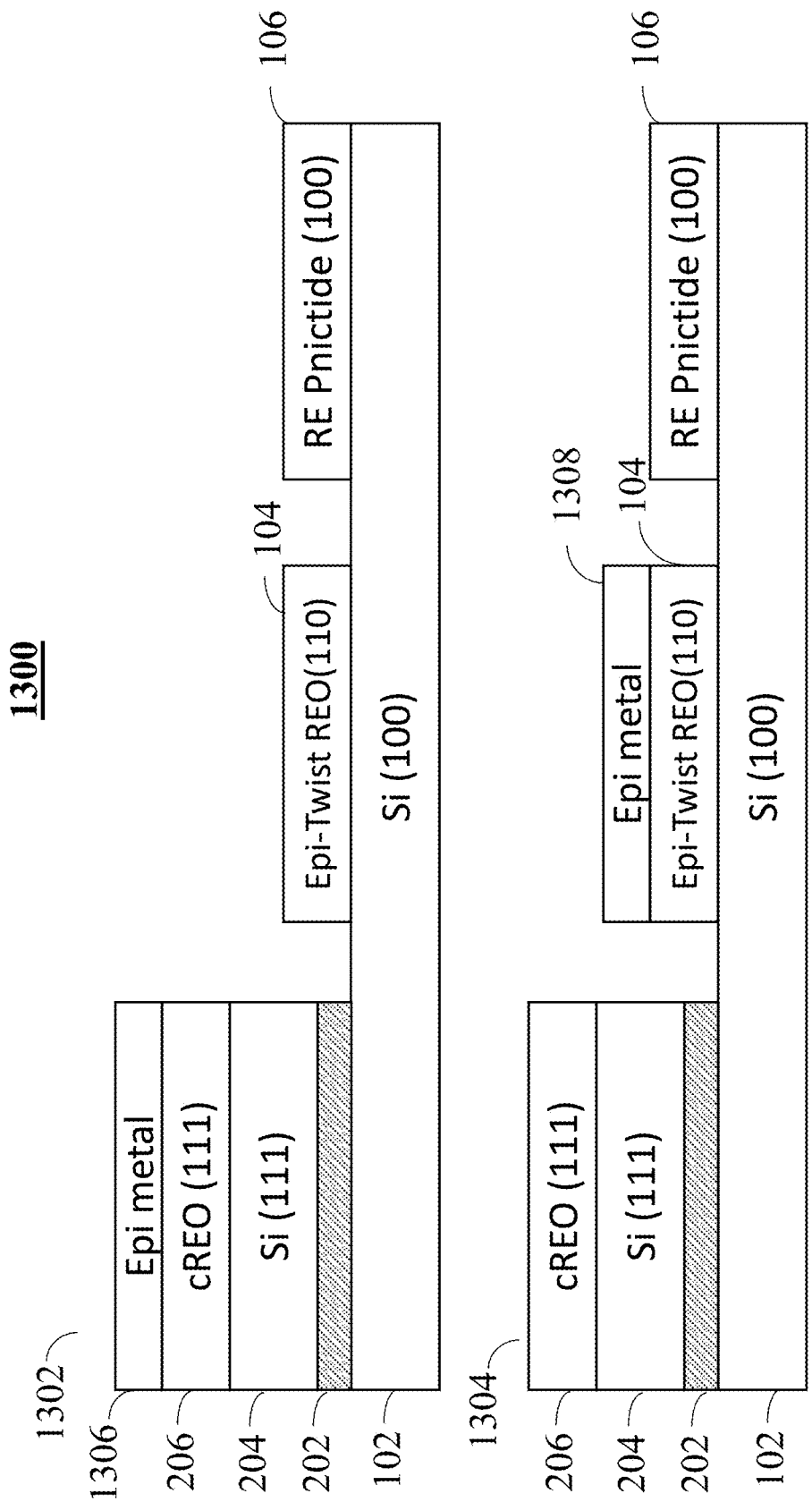
FIG. 13 provides an example diagrams illustrating different examples of growing epitaxial metal layers on separated stacks of different devices, respectively, on the silicon substrate according to an embodiment described herein.

FIG. 13 provides an example diagrams illustrating different examples of growing epitaxial metal layers on separated stacks of different devices, respectively, on the silicon substrate according to an embodiment described herein. Layered structure 1302 of FIG. 13 builds on the layered structure 200 of FIG. 2. An epitaxial metal layer 1306 is grown over cREO layer 206 of layered structure 200 of FIG. 2. In layered structure 1304, the epitaxial metal layer 1308 is grown over epi-twist REO layer 104 of layered structure 200 of FIG. 2.

Figure 14:
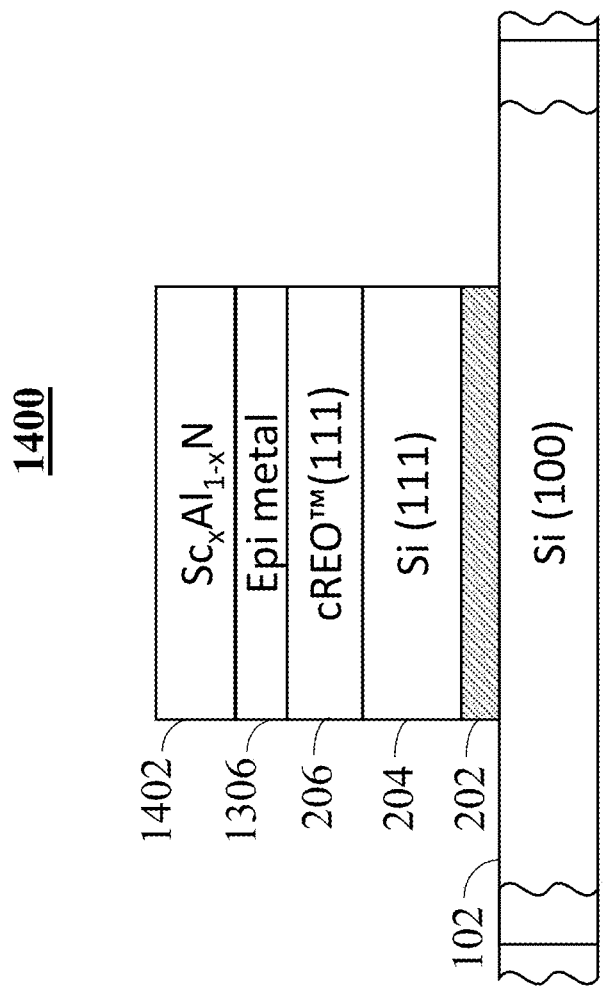
FIG. 14 provides an example block diagram 1400 illustrating different examples of integrating an III-N device layer into the structures described in FIG. 13, respectively, on the silicon substrate, according to an embodiment described herein.

FIG. 14 provides an example block diagram 1400 illustrating different examples of integrating an III-N device layer into the structures described in FIG. 13, respectively, on the silicon substrate, according to an embodiment described herein. As shown at layered structure 1400 which is similar to the first stack of layers in FIG. 13, a III-N layer of the form $Sc_xAl_{1-x}N$ is grown over the epitaxial metal layer 1306 off layered structure 1400 of FIG. 14.

Figure 15A:
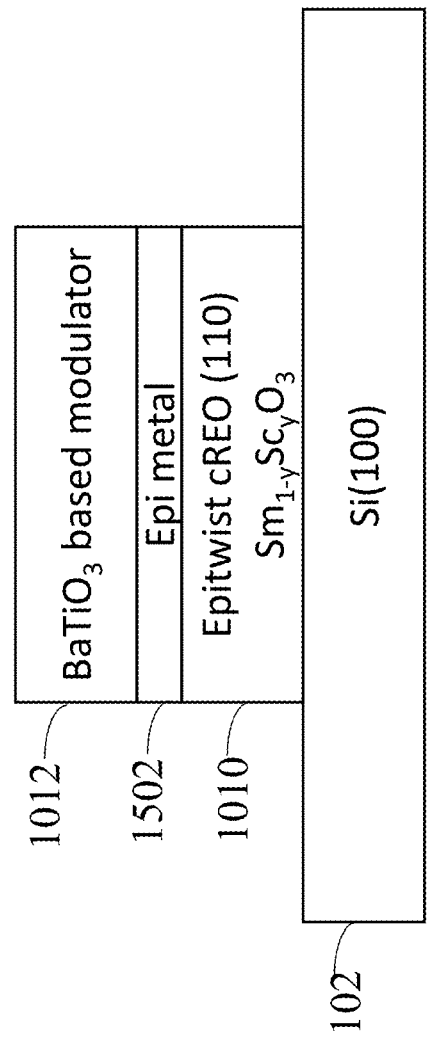
FIGS. 15A-B provide example block diagrams illustrating different examples of integrating an epitaxial metal electrode into the structures on the silicon substrate, according to an embodiment described herein.

FIG. 15A provide example block diagram 1500a illustrating different examples of integrating an epitaxial metal electrode into the structures described in FIG. 10A, respectively, on the silicon substrate, according to an embodiment described herein. As shown at 1500a which is similar to the first stack of layers 1002 in FIG. 10, a first epitaxial metal (e.g., having an orientation of <221>) 1502 is grown between the epitwist cREO layer 1010 and the $BaTiO_3$-based modulator 1012.

Figure 15B:
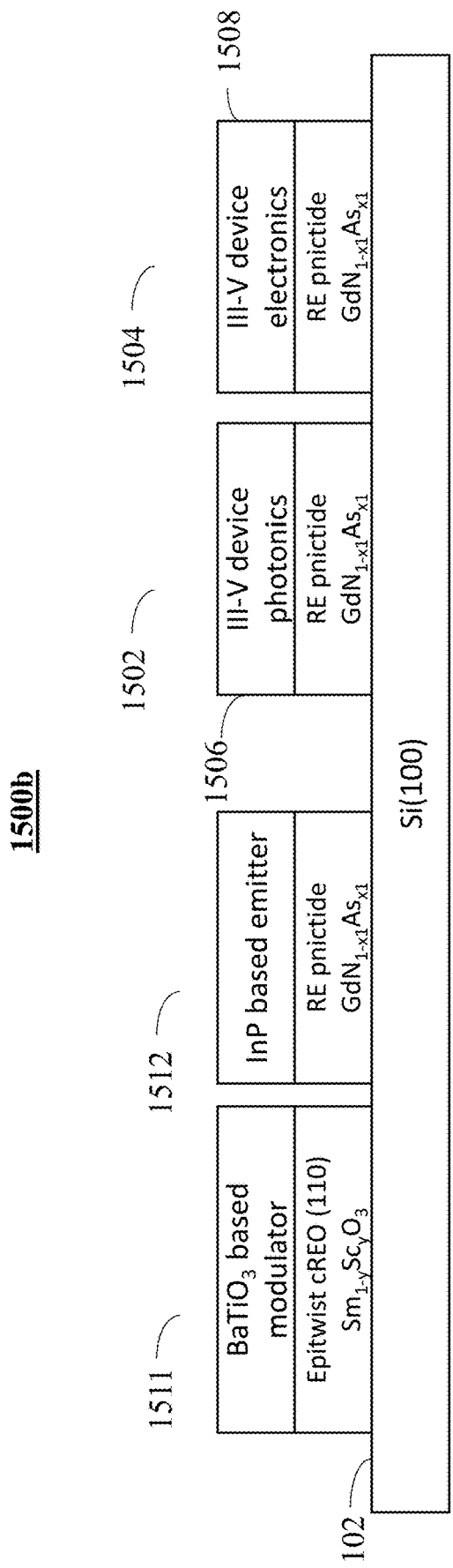

FIG. 15B provides an example block diagram 1500b illustrating selective processing on a silicon wafer using epitaxy to produce spatial integration of various photonic and/or electronic devices, according to an embodiment described herein. As shown at diagram 1500b, various combinations of photonics and electronics using epitaxy can be grown on different epitwist cREO layers with lattice matched. For example, on the silicon wafer 102, a first stack 1511 containing epitwist cREO and the $BaTiO_3$-based modulator and a second stack 1512 containing a rare earth pnictide layer and an InP-based emitter can be grown at spatially separated regions. In addition, the rare earth pnictide layer can be grown at different regions for integration of different photonics such as emitters, detectors, and/or the like, and different electronics such as FETs, bipolar devices, and/or the like. For example, stack 1502 shows a rare earth pnictide layer grown at a third region on the Si substrate 102, and a III-V photonic device 1506 grown over the rare earth pnictide layer. For another example, stack 1504 shows a rare earth pnictide layer grown at a fourth region on the Si substrate 102, and a III-V electronic device 1508 grown over the rare earth pnictide layer.

Figure 16:
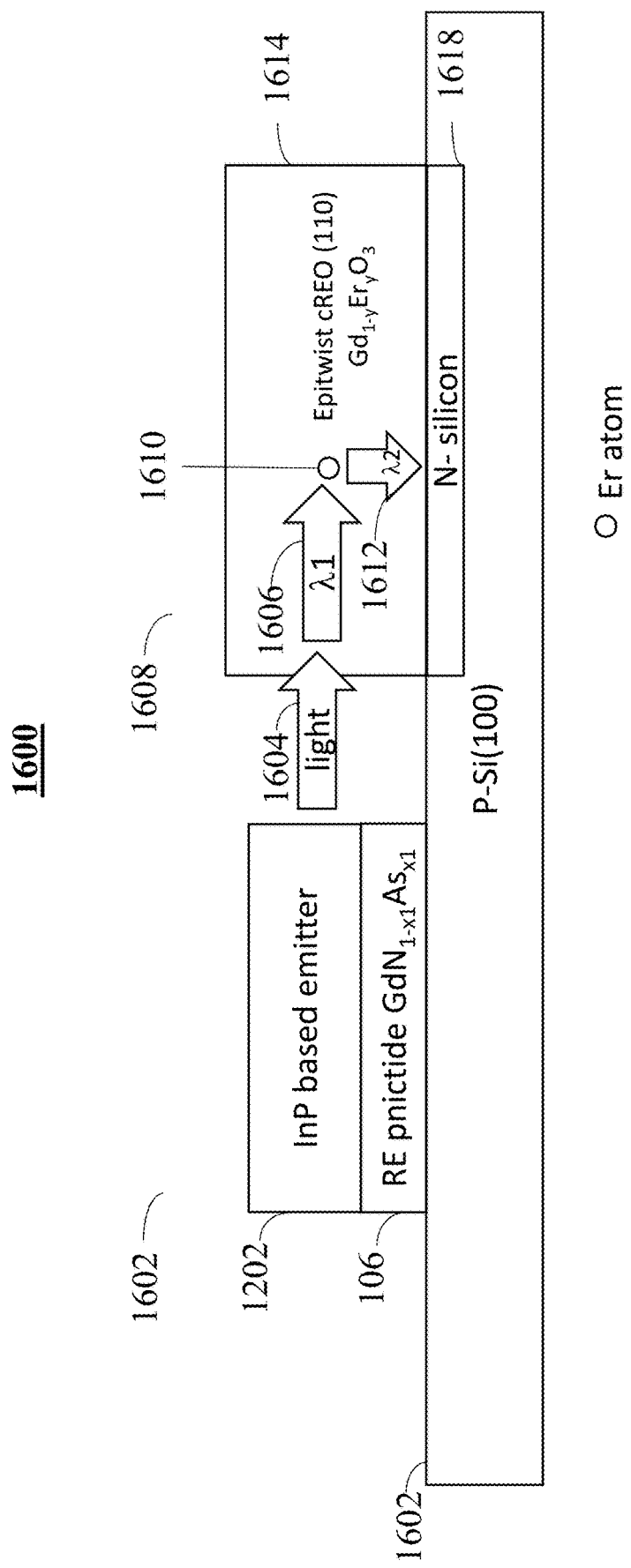
FIG. 16 provides an example block diagram illustrating optical properties of the spatially integrated structure based on a silicon substrate, according to an embodiment described herein.

FIG. 16 provides an example block diagram 1600 illustrating optical properties of the spatially integrated structure based on a silicon substrate similar to that described in FIG. 10, according to an embodiment described herein. In some embodiments, at a first region of porous silicon substrate 1602, a RE-pnictide layer 106 is grown over the porous silicon substrate 1602. In some embodiments, the RE-pnictide layer may be composed of $GdN_{1-x1}As_{x1}$. A layer of InP based emitter 1202 is grown over the RE pnictide layer 106. At a second region of the porous silicon substrate 1602, an additional epitwist cREO layer of <110> 1614 may be grown. For example, the epitwist cREO 1614 may be composed of $Gd_{1-y}Er_yO_3$ (0≤y≤1). The porous silicon substrate 1602 may be added with a PIN diode such that the p-type silicon portion having an orientation of <100>, and the N-type silicon 1618 portion may be aligned with the cREO layer 1614.

The cREO layer 1614, which incorporates Er, may be used for upconversion of lights emitted from the InP-based emitter. For example, the light 1604 at a first wavelength 1606 of 1550 nm may be converted by the Er atoms 1610 within the epitwist cREO layer 1614 to a visible wavelength 1612. In this way, the light at the second wavelength 1612 can be detected by the silicon diode.

Figure 17:
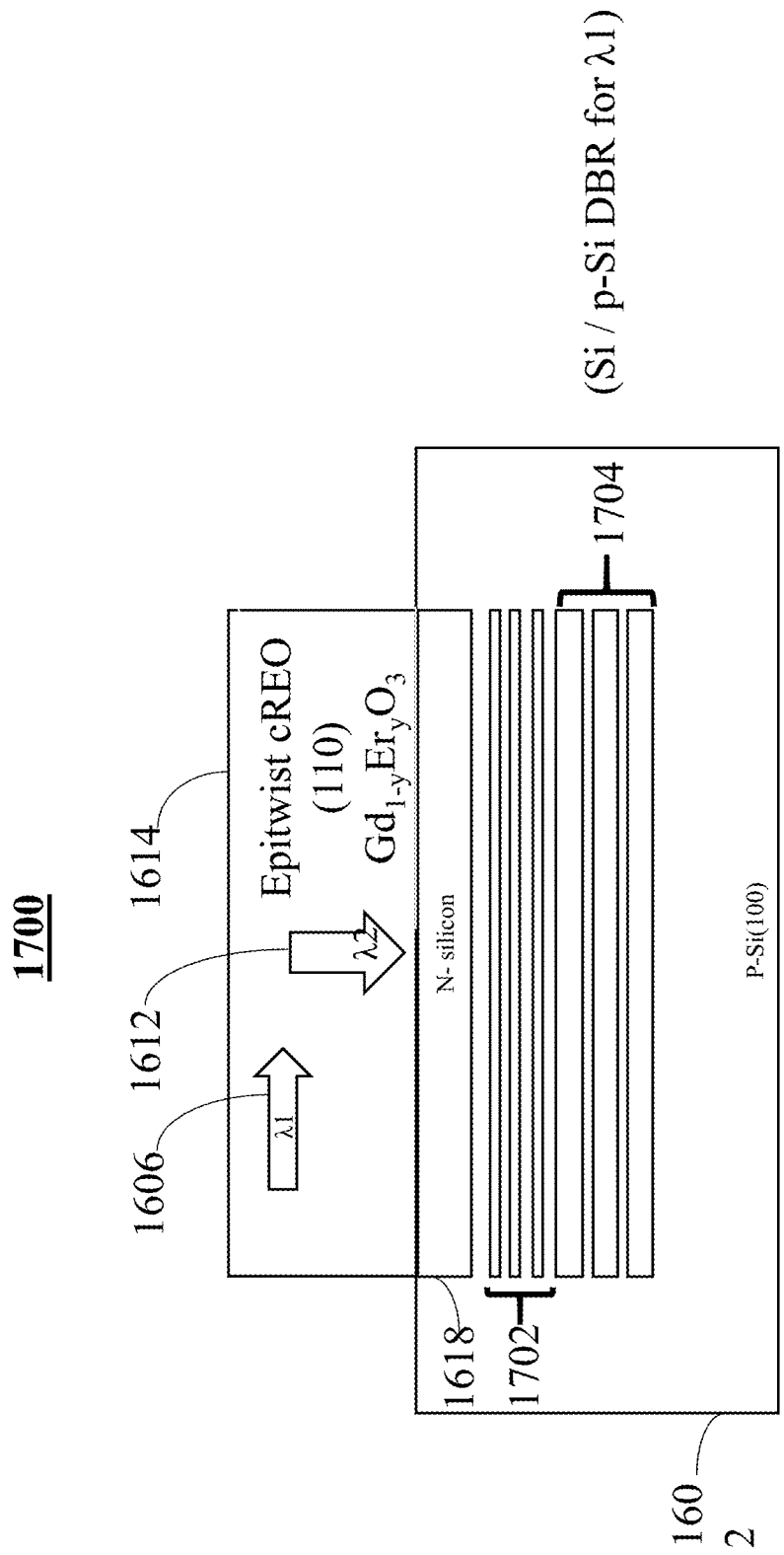
FIG. 17 provides an example block diagram illustrating porous silicon as a substrate to grow an epitwist cREO layer for perovskites, according to an embodiment described herein.

FIG. 17 provides an example block diagram 1700 illustrating using porous silicon as the substrate to grow an epitwist cREO layer for perovskites, according to an embodiment described herein. Diagram 1700 shows a porous silicon substrate 102 of <100>, whereas a portion of the substrate is modified to be porous. The porous silicon portion may be selected to have different porosities. For example, a first porosity of the porous portion 1704 may be selected to pass through a first wavelength, and a second porosity of the porous portion 1702 may be selected to pass through a second wavelength. Thus, when lights at the first wavelength is converted to the second wavelength via upconversion at the epiwist cREO 1614, e.g., as illustrated at FIG. 16, the converted light at the second wavelength can pass through the porous portion 1702 but may be reflected at the porous portion 904. Lights at the first wavelength or the second wavelength can be harvested at the cREO layer 1614 as the two wavelengths may be reflected back into the cREO 1614 or the PIN diode (e.g., the n-type silicon 1618).

The Si-based porous portions 1702 and 1704 may be aligned with the n-types silicon 414 within the silicon wafer. The porous portion 1702 and 1704 may form a distributed bragg reflector (DBR). In various embodiments, the regions of porous silicon portions 1702 and 1704 may be placed beneath any element grown on the substrate. Further integration and implementation of a porous Si DBR can be found in commonly-owned and U.S. provisional application no. 62/618,985, filed Jan. 18, 2018, which is hereby expressly incorporated by reference in its entirety.

Figure 18A:
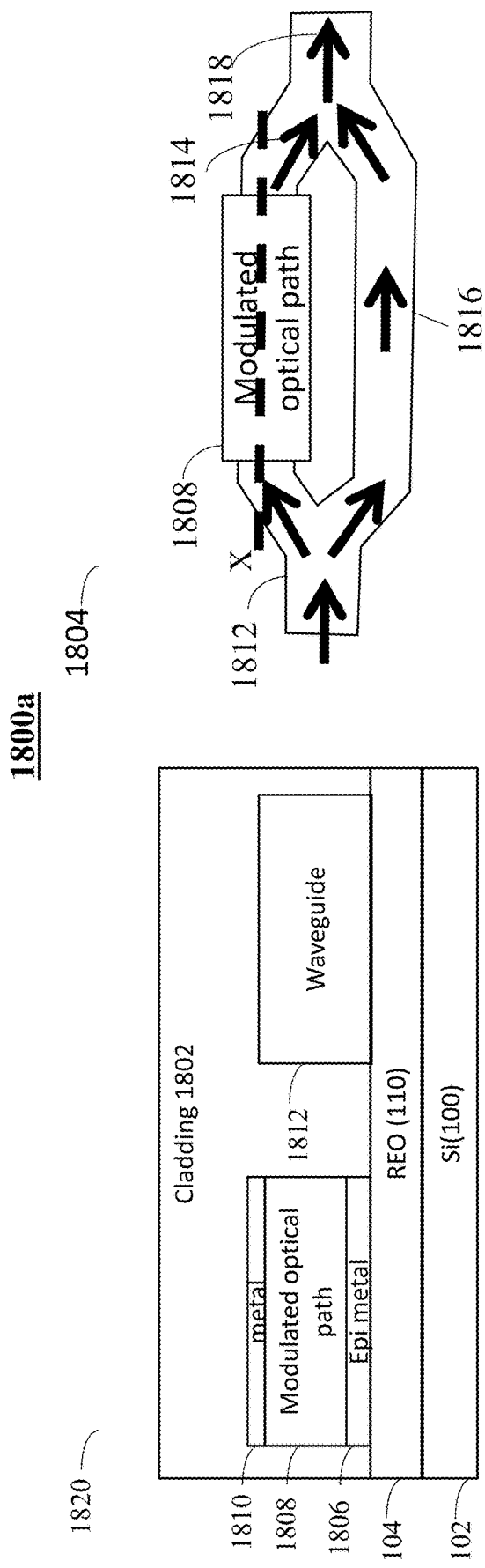
FIGS. 18A-C provide example block diagrams illustrating an integration of a modulator and one or more waveguide(s) into an REO buffer, according to an embodiment described herein.
Figure 18B:
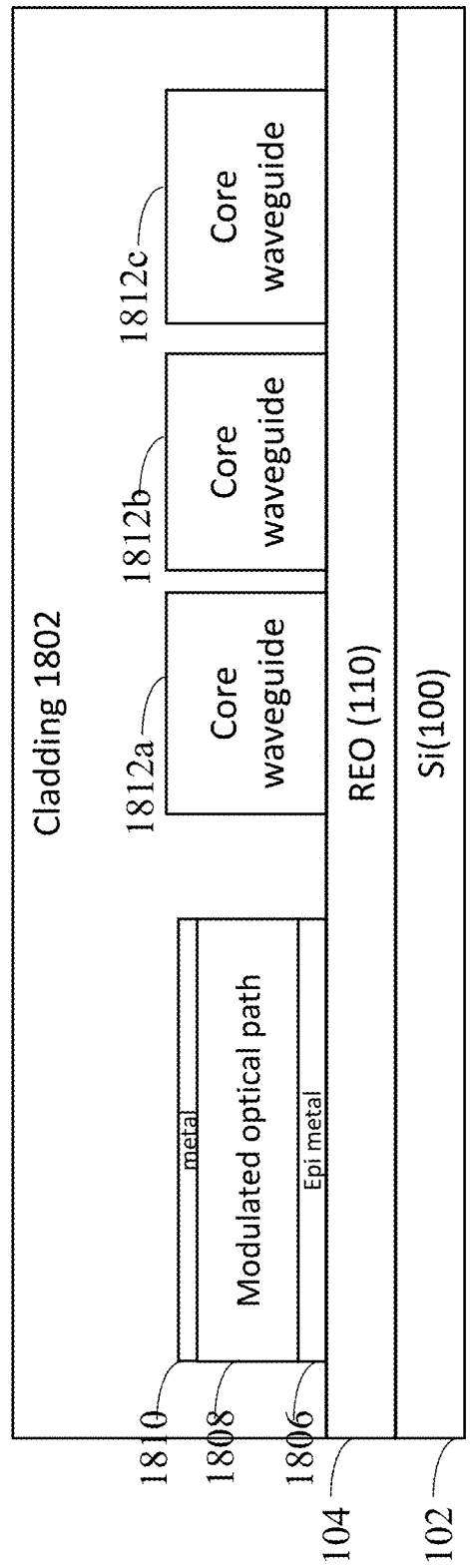
Figure 18C:
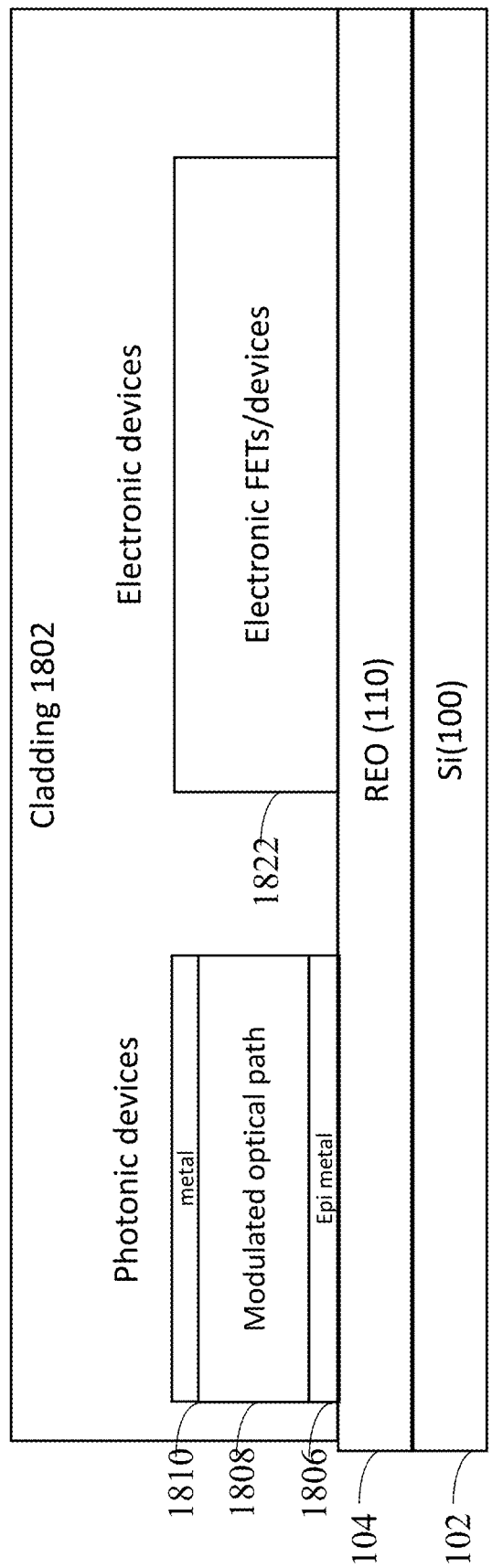

FIGS. 18A-C provide example block diagrams illustrating an integration of a modulator and one or more waveguide(s) into an REO buffer, according to an embodiment described herein. In FIG. 18A, diagram 1800a shows a cross-section view of the plan view 1804 at the cross-section "X." In diagram 1820, a first stack of a first epitaxial metal 1806, a modulated optical path 1808 and a second metal layer 1810 may be grown at a first region on top of the REO layer 104, that is gown over a silicon substrate 102. A waveguide 1812 may be grown at a spatially separated second region on top of the REO layer 104. A cladding material 1802 may be used to wrap around and fill in the space between the first stack and the second stack. Specifically, the refractive index of either the first stack or the second stack is selected to be greater than the cladding refractive index of the cladding material 1802. The refractive index of the REO (110) 104 may be smaller than the core refractive index of the waveguide 1812. The structure shown at 1820 is formed on the silicon substrate of <100>, which allows integration with Si electronics.

At diagram 1804 which illustrates the plan view of the layered structure 1800, lights may pass through the waveguide 1812, whereas lights are split into two beams to pass through modulated optical path 1808. A first beam of light may enter the modulated optical path 1808 to be modulated into a first modulated beam of light 1814. A second beam of light may enter the optical path 1816. In some embodiments, to be modulated into a second modulated beam of light 1816. The two modulated beams of light 1814 and 1816 may be mixed to form a combined beam of light 1818. The cross-section view at "X" of diagram 1804 may be similar to diagram 1820.

Diagram 1800b in FIG. 18B shows that multiple waveguides 1812a, 1812b and 1812c may be integrated onto the REO layer 104. For example, the multiple waveguides may serve passive photonic functions, e.g., splitter, combiner, multiplexer, de-multiplexer, spot-size converter and/or the like.

Diagram 1800c in FIG. 18C shows another example of integration of photonic and electronic devices onto the REO layer 104 on a single wafer. For example, selective areas on the single wafer of the REO layer 104 can be used for electronics and photonics device epitaxy. Photonic devices such as modulators, detectors, waveguides, splitters etc. may be integrated into the stack of 1806, 1808 and 1810. Electronic devices such as an electronic FET 1822 may be integrated into the same REO layer 104.

Figure 19:
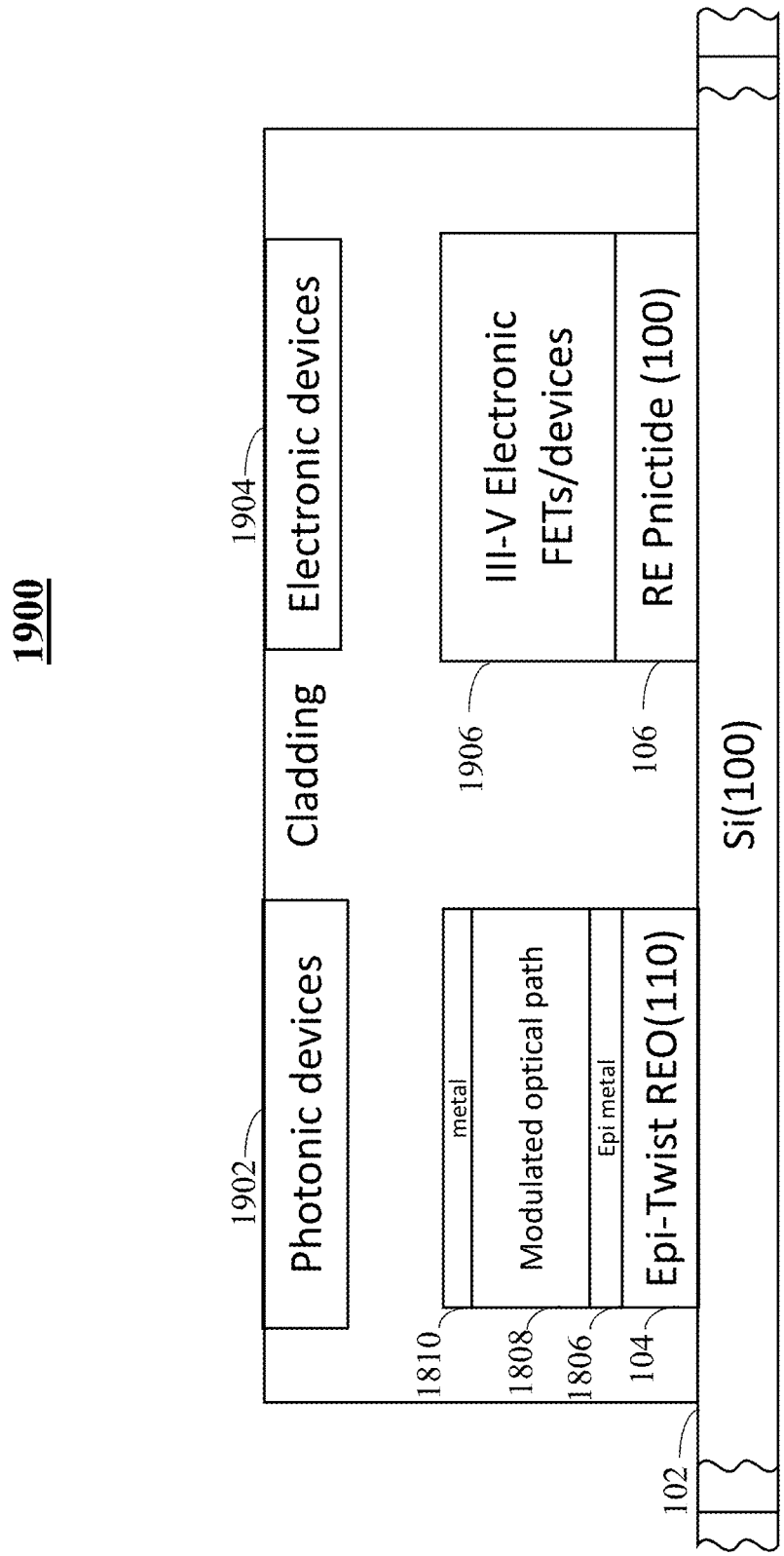
FIG. 19 provides an example block diagram illustrating an integration of electronic and photonic devices on a silicon substrate, according to an embodiment described herein.

FIG. 19 provides an example block diagram illustrating an integration of electronic and photonic devices on a silicon substrate, according to an embodiment described herein. As shown in FIG. 18A, photonic devices 1902 may be grown at a first region of the silicon substrate 102. Similarly, electronic devices 1904 may be grown at a second region of the silicon substrate 102. The photonic devices may be composed of epi-twist REO layer 104, epitaxial metal layer 1806 over the epi-twist REO layer 104, a modulated optical path 1808 over the epitaxial metal layer 1806, and metal layer 1810 over the modulated optical path 1808. Similarly, at a second non-overlapping region of silicon substrate 102, a RE-pnictide layer 106 may be grown over the silicon substrate 102. The RE-pnictide layer 106 may be used as a base to grow III-V electronic devices 1906. In this way, the silicon substrate 102 is able to grow both photonic devices 1902 and electronic devices 1904 simultaneously.

Figure 20:
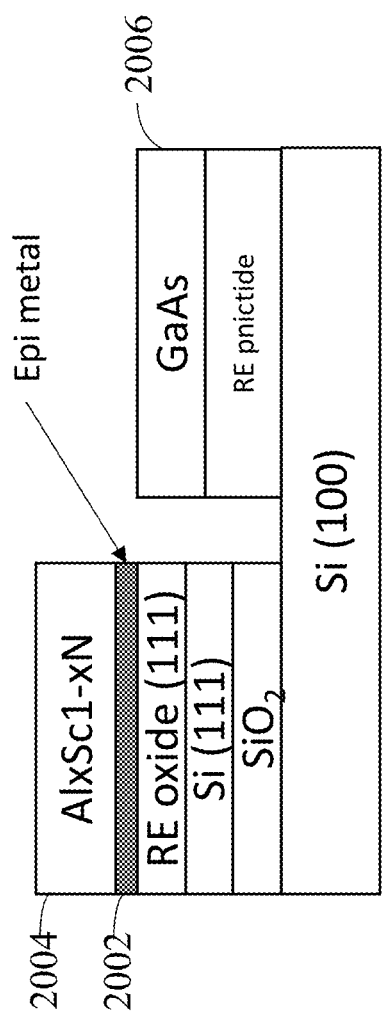
FIG. 20 provides an example diagram showing a mixed electronic/RF structure with an epitaxial metal layer, according to an embodiment.

FIG. 20 provides an example diagram 2000 showing a mixed electronic/RF structure with an epitaxial metal layer, according to an embodiment. In the structure 2000, a layer 2004 composed of $Al_xSc_{1-x}N$ ($0 \le x \le 1$), e.g., as an Al(Sc)N-based radio-frequency filter, is grown over the REO layer within the first stack, and GaAs 2006 is grown over the rare earth pnictide layer within the second stack. Within the first stack, the REO layer having an orientation of <111> acts as buffer where an additional epitaxial metal layer 2002 and the $Al_xSc_{1-x}N$ layer 2004 can be grown over the <111> Silicon portion of the SOI substrate. Within the second stack, the rare earth pnictide may act as a buffer for the GaAs layer 2006 and any subsequent III-V power amplifier epitaxially grown over the GaAs layer 2006.

Figure 21:
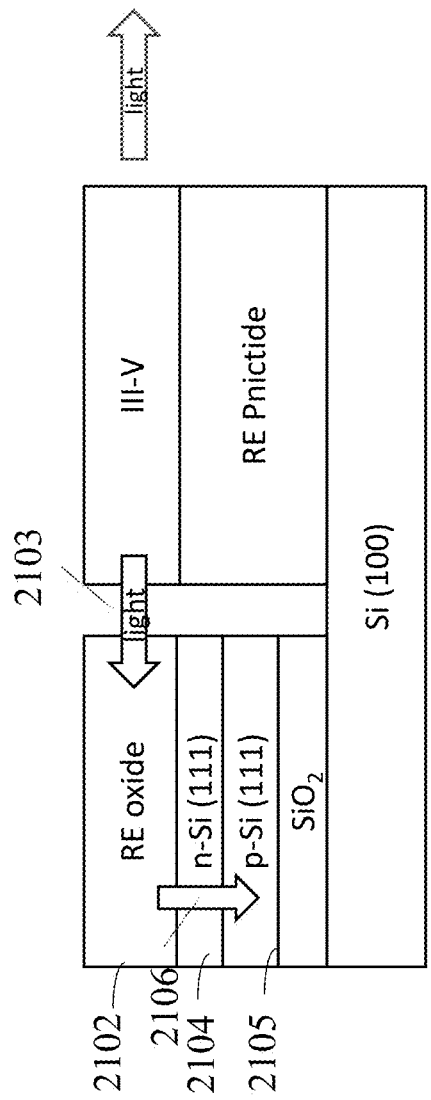
FIG. 21 provides an example diagram showing optical interactions between the formed two stacks within the two regions on the silicon substrate in a layered structure similar to those illustrated in FIG. 20, according to an embodiment.

FIG. 21 provides an example diagram 2100 showing optical interactions between the formed two stacks within the two regions on the silicon substrate in a layered structure similar to those illustrated in FIG. 20, according to an embodiment. Specifically, as shown in FIG. 21, light 2103 emitted from the III-V layer within the second stack may reach the REO layer within the first stack, which in turn passes through the light to the silicon layer having an orientation of <111>. At the REO layer 2120, upconversion may be used to convert the light to a detectable wavelength for the Si diode at the SOI substrate. For example, at the REO layer 2102, the rare earth element may absorb light 2103 at a specific wavelength and remit the light 2106 at a shorter wavelength. An example option of the rare earth element may be Er, which interacts with lights at the wavelength of 1550 nm and then produces a light at wavelength ranging from 980 to 530 nm. The Si <111> layer (e.g., similar to 106 in FIG. 1) contains the p-n junctions 2104-2105 that can act as a diode, and respond to the remitted light 2106 at a shorter wavelength.

Figure 22:
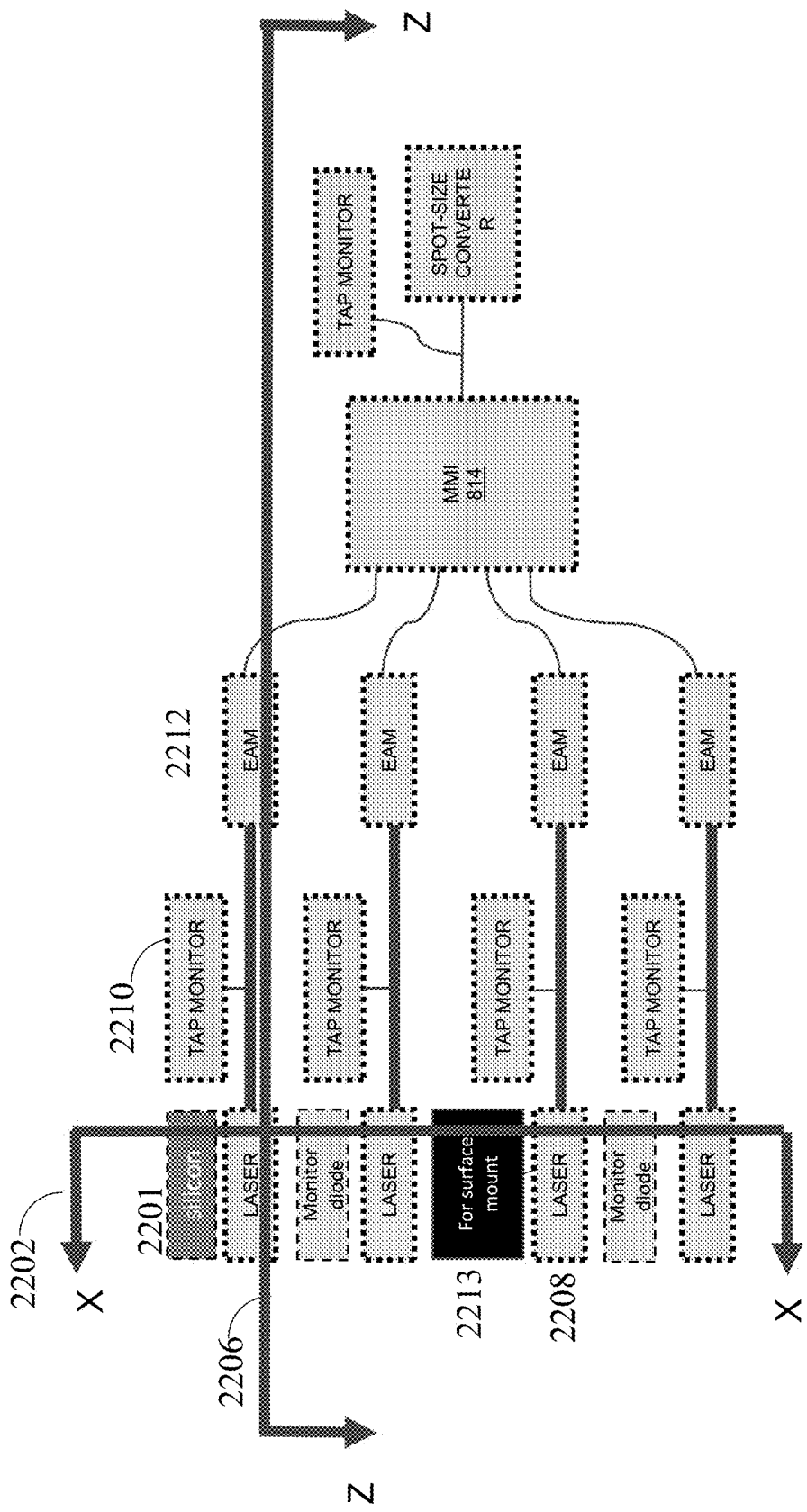
FIGS. 22-24 provide example layout diagram showing different applications of the layered structure according to an embodiment.
Figure 23:
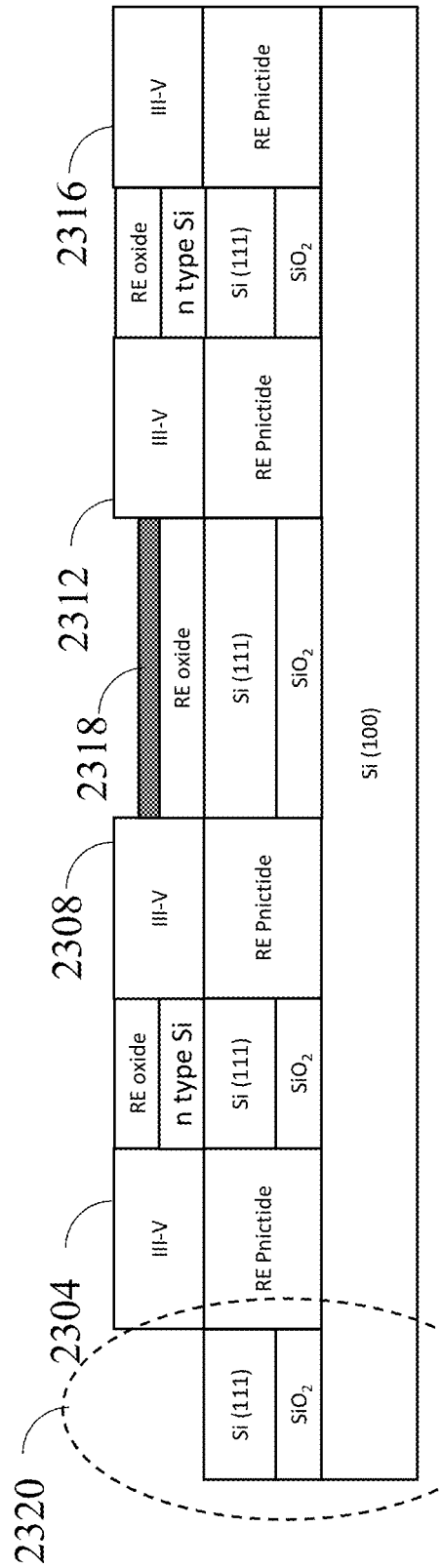
Figure 24:
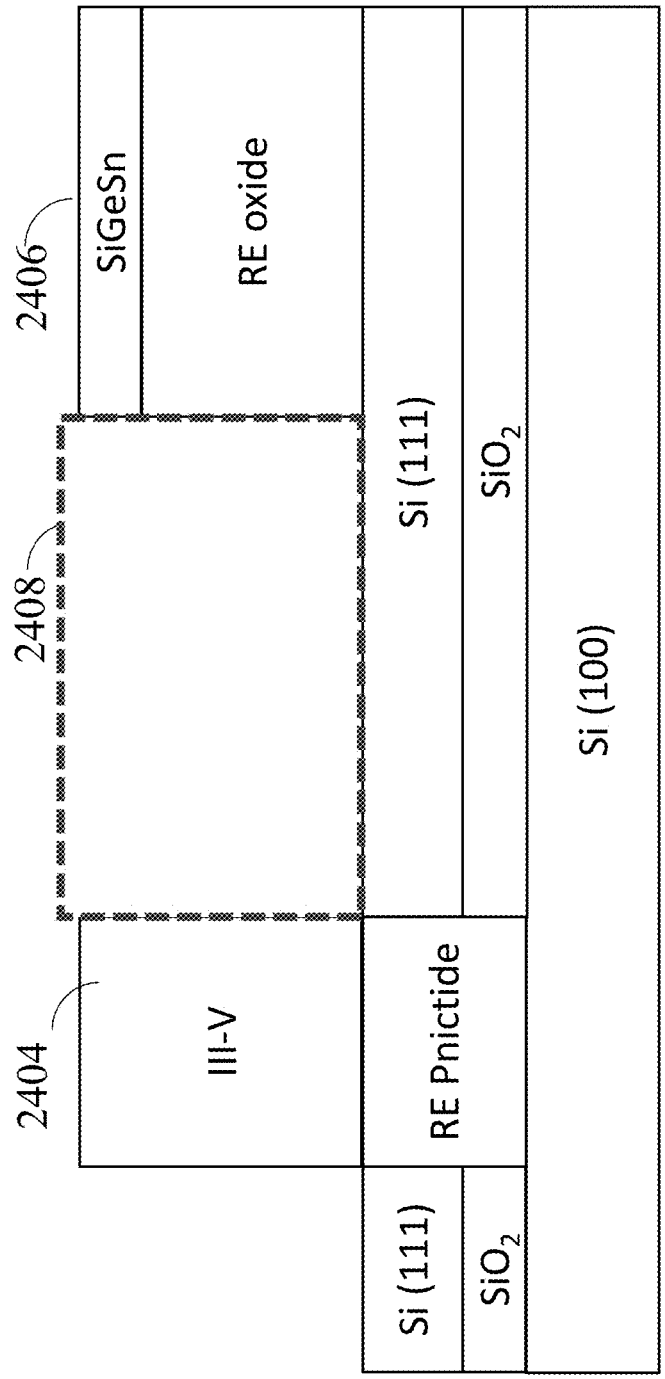

FIGS. 22-24 provide example layout diagram showing different applications of the layered structure similar to those illustrated in FIGS. 1-21 and 23-27, according to an embodiment. Diagram 2200 in FIG. 22 shows a PIC chip layout at a transceiver. For example, photonic devices such as lasers 2208, electronic devices such as tap monitors 2210, an electron-absorption modulator (EAM) 2212, an multi-mode interface (MMI) 2213 and/or the like may be integrated into the same epitaxial platform in a similar way as shown in FIGS. 1-21. As the photonic devices and electronic devices share the same epitaxial platform, the size or dimension of the circuit chip may be small, e.g., with a 1.5×2.5 mm chip area for four lasers multiplexed into one fiber.

Diagram 2300 in FIG. 23 and diagram 2400 in FIG. 24 show alternative embodiments of a cross-section layout for building the circuit layout 2200 shown in FIG. 22, including repetitions of structures similar to that shown in FIG. 1. For example, diagram 2300 shows a cross-section view of the circuit chip 2200 at a position "X" 2202, where the (four) lasers 2208 may be integrated into the (four) regions of III-V alloys 2304, 2308, 2312 and 2316. The for-surface mount portion 2318 (e.g., corresponding to 2213 in FIG. 22) may be an island of oxide that allows a component to be placed on the PIC, and may be electrically isolated from neighboring elements. For example, the for-surface mount portion 2318 may include a layer of epi metal for connectivity. The SOI portion 2320 (e.g., corresponding to 2201 in FIG. 22) may be a region designed for upstream processing, e.g., by using porous process to optically isolate/guide the adjacent laser by converting Si to p-type Si.

For another example, diagram 2400 shows a cross-section view of the circuit chip 2200 at a position "Z" 2206, where a laser (e.g., 2208) can be integrated into the III-V region 2404, and an EAM (e.g., 2212) may be integrated into the SiGeSn layer 2406, respectively. A waveguide (not shown in FIG. 22) can be inserted at 2408 using the silicon layer of <111>.

Figure 25:
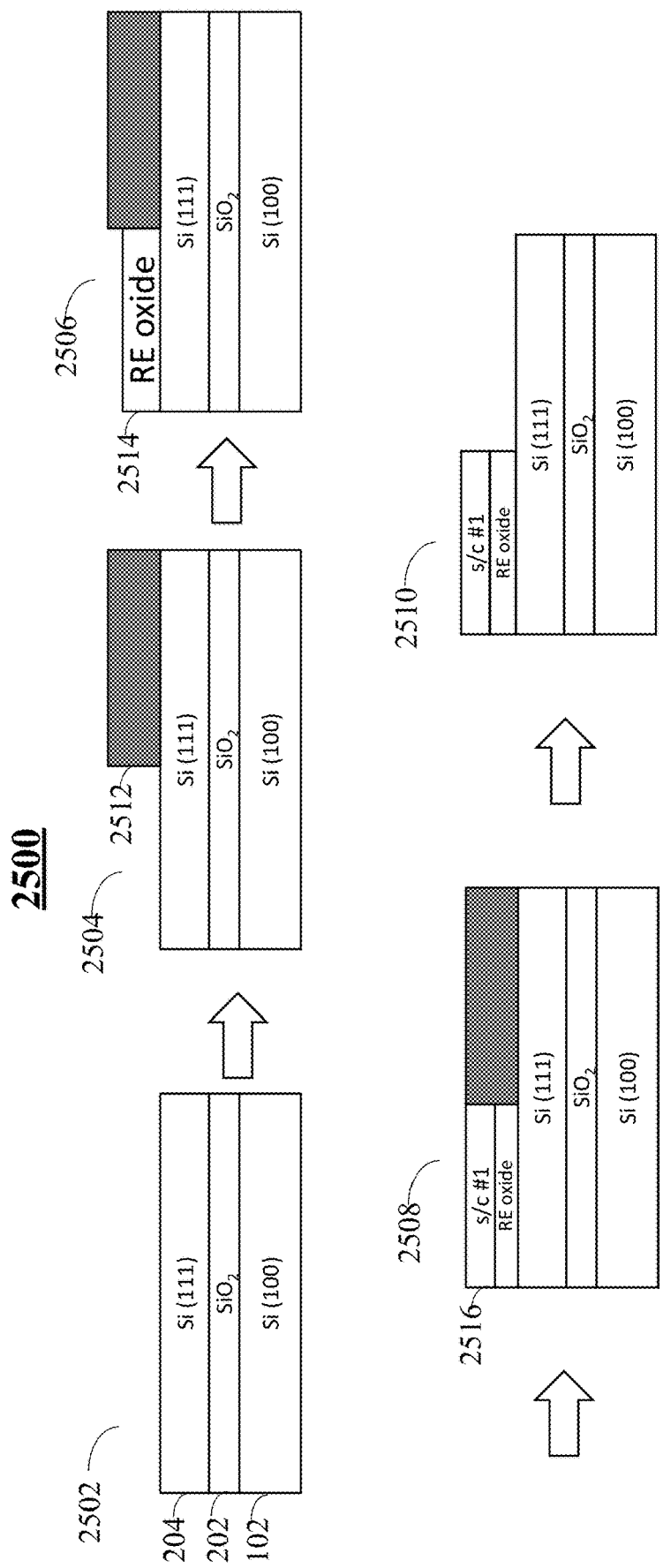
FIGS. 25-26 provide an example process to form the example structures shown in FIGS. 10A-B, according to an embodiment.
Figure 26:
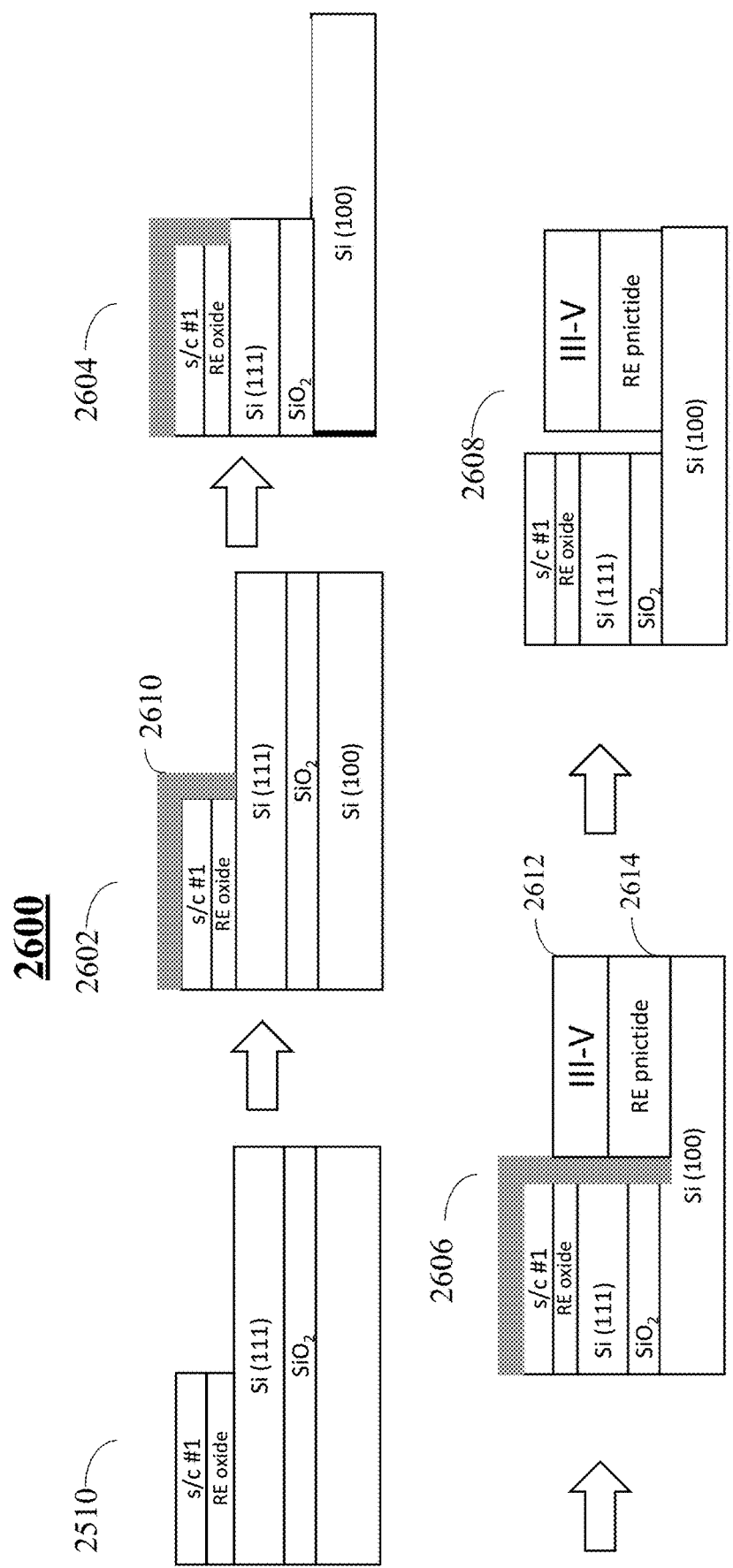

FIGS. 25-26 provide example processes 2500-2600 to form the example structures 1000a shown in FIG. 10A, according to an embodiment. Process 2500 may start at step 2502 with an SOI substrate. For example, the SOI substrate may include the first silicon substrate 102 of <100>, an insulator layer 202 composed of $SiO_2$ and a second silicon layer 204 of <111>, as discussed in FIG. 2. At step 2504, a mask 2512 is formed at a region on top of the SOI substrate. At step 2506, an REO layer 2514 can be grown on the SOI substrate at a region that is not masked by the mask 2512. At step 2508, a photonic device (e.g., SiGeSn) may be integrated into the structure by growing over the REO layer 2514. At step 2510, the mask 2512 may be removed to expose the previously masked available region on the SOI substrate.

Continuing on with process 2600 in FIG. 26, at step 2602, another mask 2610 that is used to protect the formed first stack including the photonic device of step 2510 from additional processing steps and to separate the first stack from a second stack to be formed on the SOI substrate. At step 2604, the SOI substrate is modified in a way such that the insulator layer and the second silicon layer on top of the insulator layer are removed by well-etching techniques to align with the region defined by the mask 2610. In this way, an available region on the original silicon substrate 102 is exposed. At step 2606, the insulator layer and the second silicon layer are further resized such that the mask 2610 is extended to form a shield that separates the formed first stack of the insulator layer, the second silicon layer, the REO layer and the photonic device from growth of other layers on the other side of the mask 2610. Thus, at the exposed available region that is separated by the mask 2610 on the original silicon substrate 102, a rare earth pnictide layer 2614 is grown, and the III-V layer 2612 is grown over the rare earth pnictide layer 2614. At step 2608, the mask 2610 is removed, and two stacks of layered structures similar to that illustrated in FIG. 10A are formed on the silicon substrate 102.

It is worth noting that in FIGS. 25-26, two stacks of layers are formed from the silicon substrate 102 and/or the SOI substrate including 102, 104 and 106. However, multiple stacks, or multiple repetitions of the stacks of layers can be formed in a similar way (e.g., by repeating processes 2500-2600) to form a common epitaxial platform for photonic devices and electronic devices, e.g., as shown in the cross-section views 900-1000 of a circuit layout in FIGS. 22-23.

Figure 27:
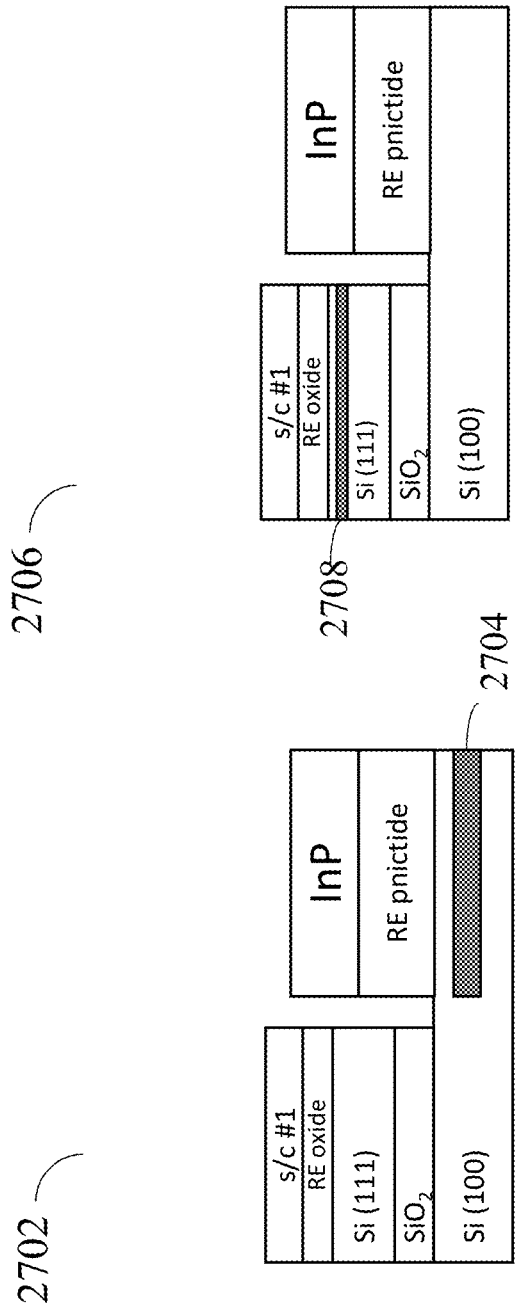
FIG. 27 provides example diagrams that show different ways to manipulate the silicon substrate during the process illustrated in FIGS. 25-26, according to an embodiment.

FIG. 27 provides example diagrams 2702 and 2706 that show different ways to grow different layers on the silicon substrate during the process illustrated in FIGS. 25-26, according to an embodiment. In some embodiments, prior to manufacture of the SOI wafer at step 2502 in FIG. 25, part of the first silicon substrate 102 in FIG. 25, may be modified to form a porous portion 2704 via a porous silicon process such that the porous portion 2704 aligns with and interacts with the device grown upon the substrate, e.g., the rare earth pnictide and the InP on top of the porous portion 2704. In another example, prior to the deposition of any rare earth-based material at step 2506 in FIG. 25, part of the second silicon wafer 204 may be modified to form a porous portion 2708 via the porous silicon process such that the porous portion 2708 aligns with and interacts with the device grown upon the silicon layer, e.g., the REO layer and the photonic device.

As described herein, a layer means a substantially-uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire. A substrate may have a single bulk wafer, or multiple sub-layers. Specifically, a silicon substrate may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure, comprising:
   a substrate;
   an epi-twist rare earth oxide layer over a first region of the substrate; and
   a rare earth pnictide layer over a second region of the substrate, wherein the first region and the second region are non-overlapping.
2. The layered structure of claim 1, wherein the substrate is a silicon substrate having a crystal orientation of (100), wherein the epi-twist rare earth oxide layer has a crystal orientation of (110), and wherein the rare earth pnictide layer has a crystal orientation of (100).
3. The layered structure of claim 2, further comprising:
   an interface layer over a third region of the substrate, wherein the third region is separate from the first region and the second region,
   wherein the interface layer is composed of silicon dioxide or a wafer bonding material;
   a silicon layer over the interface layer.
4. The layered structure of claim 3, wherein the silicon layer has a crystal orientation of (111), and the layered structure further comprises:
   a rare earth oxide layer having a crystal orientation of (111) over the silicon layer.
5. The layered structure of claim 4, further comprising:
   a combination of devices selected from a group of III-V devices, III-N devices, oxide photonic devices, electronic devices and radio frequency devices, over an upper surface of one or more of the epi-twist rare earth oxide layer, the rare earth pnictide layer and the rare earth oxide layer.
6. The layered structure of claim 5, wherein the combination of devices further comprises one or more of:
   a perovskite oxide, a $BaTiO_3$ based modulator, an InP based emitter, a III-N High-electron-mobility transistor, a polar, non-polar or semi-polar III-N device, an epitaxial metal, and a $Sc_xAl_{1-x}N$ filter.
7. The layered structure of claim 4, further comprising:
   an epitaxial metal layer over the epi-twist rare earth oxide layer aligning with the first region, or over the rare earth oxide layer aligning with the third region.
8. The layered structure of claim 3, wherein the silicon layer has a crystal orientation of (100), and the layered structure further comprises:
   another rare earth pnictide having a crystal orientation of (100) over the silicon layer.
9. The layered structure of claim 2, wherein either of the substrate and the silicon layer includes a porous silicon portion.
10. The layered structure of claim 2, wherein either of the substrate and the silicon layer comprises a first portion of a first electrical doping type, and a second portion of a second electrical doping type, and
    wherein the first portion and the second portion of different electrical doping types are generated by adding an additional silicon epitaxial layer to the substrate or the silicon layer to change electrical doping of the substrate or the silicon layer.
11. The layered structure of claim 2, wherein the substrate is a p-type silicon substrate having a portion of n-type silicon that aligns with the first region at an upper surface of the substrate, and the layered structure further comprises:
    an InP based emitter over the rare earth pnictide layer; and
    wherein the epi-twist rare earth oxide layer is composed of Gd1-yEryO3, and wherein Er atoms at the epi-twist rare earth oxide layer are configured to convert a first wave length of light waves emitted from the InP based emitter to a second wave length that is detectable by the portion of n-type silicon.
12. The layered structure of claim 11, wherein the substrate comprises:
    a first porous portion underneath and aligning with the n-type silicon portion, wherein the first porous portion forms a first distributed Bragg reflector that passes the second wave length; and
    a second porous portion underneath and aligning with the first porous portion, wherein the second porous portion forms a second distributed Bragg reflector that passes the first wave length.
13. The layered structure of claim 1, wherein the substrate is a silicon substrate having a crystal orientation of (111), and the layered structure further comprises:

a stack of an interface layer and a silicon layer having a crystal orientation of (100) over the interface layer, wherein the stack covers the first region and the second region, and is between the substrate, and the epi-twist rare earth oxide layer and the rare earth pnictide layer; and a rare earth oxide layer having a crystal orientation of (111) over a third region of the substrate that is separate from the first region or the second region.

14. The layered structure of claim 13, wherein locations of the epi-twist rare earth oxide layer, the rare earth pnictide layer and the rare earth oxide layer are interchangeable.

15. The layered structure of claim 14, further comprising: another stack of another interface layer and another silicon layer, wherein the other stack is directly over the silicon layer and aligns with one of the first region and the second region, and wherein one of the epi-twist rare earth oxide layer, the rare earth pnictide layer and the rare earth oxide layer is over the other silicon layer.

16. The layered structure of claim 1, wherein the substrate is a germanium substrate having a crystal orientation of (100).

17. The layered structure of claim 1, wherein the substrate is a silicon substrate having a crystal orientation of (100), and the layered structure further comprises:

an interface layer over a third region of the substrate, wherein the third region is separate from the first region and the second region; and a germanium layer having a crystal orientation of (100) over the interface layer.

18. The layered structure of claim 1, further comprising:
a photonic device over the epi-twist rare earth oxide layer; and
an electronic device over the rare earth pnictide layer.

19. The layered structure of claim 18, wherein the photonic device is a stack of a first epitaxial metal, a modulator, and a second epitaxial metal over the modulator; and
the electronic device is a III-V electronic field effect transistor.

20. The layered structure of claim 19, further comprising:
cladding material wrapping at least one side of the epi-twist rare earth oxide layer, the stack and the waveguide,
wherein a first refractive index corresponding to the layer forming the modulated optical path or the wave guide is greater than a second refractive index corresponding to the cladding material.

21. A layered structure, comprising:
a substrate;
an epi-twist rare earth oxide layer over the substrate;
a stack of a first epitaxial metal, a layer forming a modulated optical path, and a second epitaxial metal over the layer, wherein the stack is over a first region on the epi-twist rare earth oxide layer; and
a waveguide over a second region on the epi-twist rare earth oxide layer.

* * * * *